United States Patent
Yamamoto et al.

(10) Patent No.: US 10,276,122 B2
(45) Date of Patent: Apr. 30, 2019

(54) UNIT SHIFT REGISTER CIRCUIT, SHIFT REGISTER CIRCUIT, CONTROL METHOD FOR UNIT SHIFT REGISTER CIRCUIT, AND DISPLAY DEVICE

(71) Applicant: Sharp Kabushiki Kaisha, Sakai, Osaka (JP)

(72) Inventors: Kaoru Yamamoto, Sakai (JP); Yasuyuki Ogawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 232 days.

(21) Appl. No.: 15/522,425

(22) PCT Filed: Oct. 23, 2015

(86) PCT No.: PCT/JP2015/079955
§ 371 (c)(1),
(2) Date: Apr. 27, 2017

(87) PCT Pub. No.: WO2016/068038
PCT Pub. Date: May 6, 2016

(65) Prior Publication Data
US 2017/0323612 A1    Nov. 9, 2017

(30) Foreign Application Priority Data

Oct. 28, 2014  (JP) .................................. 2014-219622

(51) Int. Cl.
*G11C 19/00*    (2006.01)
*G09G 3/36*     (2006.01)
*G11C 19/28*    (2006.01)

(52) U.S. Cl.
CPC .......... *G09G 3/3677* (2013.01); *G11C 19/00* (2013.01); *G11C 19/28* (2013.01);
(Continued)

(58) Field of Classification Search
None
See application file for complete search history.

(56) References Cited

U.S. PATENT DOCUMENTS 5,859,630 A    1/1999 Huq
8,218,713 B2 *  7/2012 Hsu ........................ G11C 19/28
                                                 377/64

(Continued)

FOREIGN PATENT DOCUMENTS

JP    2001-506044 A    5/2001

*Primary Examiner* — Tuan T Lam
(74) *Attorney, Agent, or Firm* — Keating & Bennett, LLP

(57) ABSTRACT

In a forward shift operation, a second input signal having a higher voltage than a voltage of a first input signal is input to a second gate terminal in a case that a first gate terminal of a first transistor is charged, and a fourth input signal having a higher voltage than a voltage of a third input signal is input to a third gate terminal in a case that the first gate terminal of the first transistor is discharged. In a backward shift operation, the fourth input signal having a higher voltage than a voltage of the third input signal is input to the third gate terminal in a case that the first gate terminal of the first transistor is charged, and the second input signal having a higher voltage than a voltage of the first input signal is input to the second gate terminal in a case that the first gate terminal of the first transistor is discharged.

20 Claims, 31 Drawing Sheets

(52) U.S. Cl.
CPC ............... *G09G 2300/0408* (2013.01); *G09G 2300/0871* (2013.01); *G09G 2310/0208* (2013.01); *G09G 2310/0248* (2013.01); *G09G 2310/0286* (2013.01); *G09G 2310/08* (2013.01)

(56) References Cited

U.S. PATENT DOCUMENTS

| | | | | |
|---|---|---|---|---|
| 2011/0150169 | A1* | 6/2011 | Lin | G11C 19/28 377/64 |
| 2012/0087460 | A1* | 4/2012 | Moriwaki | H01L 27/0255 377/64 |
| 2012/0152996 | A1* | 6/2012 | McDonald | A45C 7/0059 224/602 |
| 2012/0155604 | A1* | 6/2012 | Yang | G09G 3/3677 377/79 |
| 2016/0071614 | A1* | 3/2016 | Lee | G09G 5/006 345/214 |
| 2016/0189647 | A1* | 6/2016 | Xiao | G09G 3/3677 345/92 |
| 2016/0189648 | A1* | 6/2016 | Xiao | G09G 3/3677 345/212 |
| 2016/0300623 | A1* | 10/2016 | Yang | G11C 19/28 |
| 2016/0372070 | A1* | 12/2016 | Hu | G09G 3/3614 |
| 2017/0270881 | A1* | 9/2017 | Li | G09G 3/3677 |

\* cited by examiner

US 10,276,122 B2

UNIT SHIFT REGISTER CIRCUIT, SHIFT REGISTER CIRCUIT, CONTROL METHOD FOR UNIT SHIFT REGISTER CIRCUIT, AND DISPLAY DEVICE

TECHNICAL FIELD

The some aspects of the present invention relate to a unit shift register circuit, a shift register circuit, a control method for a unit shift register circuit, and a display device.

Priority is claimed on Japanese Patent Application No. 2014-219622, filed Oct. 28, 2014 in Japan, the content of which is incorporated herein by reference.

BACKGROUND ART

As increase in definition and narrowing of frames of displays on mobile devices such as mobile telephones have progressed in recent years, many displays having a pixel density of over 400 pixels per inch (ppi) have been made into products. As a key technology for making such displays into products, a so-called monolithic circuit technology in which a driving circuit is formed on a glass substrate has been used. In addition, as back planes (circuit boards) of these, thin film transistor (TFT) circuits which use oxide semiconductors such as indium gallium zinc oxide (In—Ga—Zn—O-based semiconductors; which are oxide semiconductors containing indium (In), gallium (Ga), zinc (Zn), and oxygen (O)) have begun to be used.

Driving circuits formed using monolithic circuit technology are known in which a threshold voltage of a TFT changes depending on elapse of time or temperature. Particularly, the following problems may arise in shift register circuits used as scanning line driving circuits.

A shift register circuit boosts a gate of an output TFT which drives a scanning line to a high voltage using a bootstrap to cause it operate. In order to precharge a gate electrode of the output TFT and prevent leakage during boosting, a diode-connected TFT is used as a set TFT. When such a diode-connected set TFT is used, a precharge voltage of an output TFT has a value decreased by a threshold value of the TFT.

Since TFTs using an oxide semiconductor such as indium gallium zinc oxide have a characteristic that a threshold voltage fluctuates due to voltage stress applied to a gate electrode, characteristics degradation progresses in accordance with elapse of time, and a precharge voltage of a gate electrode of an output TFT due to a diode-connected set TFT decreases accordingly. As the precharge voltage becomes lower, a voltage boosted by a bootstrap also becomes lower, a driving force of the output TFT decreases, and thus output waveforms become blunt. If such degradation develops further, an output voltage becomes lower, and thus a shift register operation becomes unstable.

In addition, a shift register having a bi-directional scanning function in which a shift operation can be performed in both directions by a scanning line driving circuit switching between a forward direction and a backward direction has become necessary. The reason for this is that, for example, the top and the bottom of an image displayed on a display unit are easily reversed when the scanning line driving circuit performs a shift operation in the backward direction.

Patent Document 1 discloses an example of a shift register circuit which enables such a bi-directional shift operation. Each stage of the shift register circuit described in FIG. 2 of Patent Document 1 (which will be referred to as a "unit shift register circuit" also in embodiments of the present invention hereinbelow) has an output TFT (T1), a set TFT (T2), a reset TFT (T3), a set TFT (T4), and a reset TFT (T5). The T2 has a drain terminal and a source terminal in diode connection and is connected to an output of the preceding stage, and the source terminal is connected to a gate terminal of the T1. The T3 has a drain terminal connected to the gate terminal of the T1, a gate terminal connected to an output of the subsequent stage, and a source terminal connected to a VSS (power source voltage VSS) terminal. The T4 has a drain terminal and a source terminal in diode connection that are connected to an output of the subsequent stage, and the source terminal is connected to the gate terminal of the T1. The T5 has a drain terminal connected to the gate terminal of the T1, a gate terminal connected to the output of the preceding stage, and a source terminal connected to the VSS terminal. As a shift register circuit, the unit shift register circuit having the above-described configuration performs a set operation in which the T2 precharges (charges) the gate terminal of the T1 and a reset operation in which the T3 pulls down (discharges) the gate terminal of the T1 in a forward (in the direction from a preceding stage to a subsequent stage) shift operation. On the other hand, in a backward (in the direction from a subsequent stage to a preceding stage) shift operation, a set operation in which the T4 precharges the gate terminal of the T1 and a reset operation in which the T5 pulls down the gate terminal of the T1 are performed. In the unit shift register circuit disclosed in Patent Document 1, the configuration enables a scanning order of gate bus lines to be switched, without using select signals for switching the scanning order.

PRIOR ART DOCUMENT

Patent Document

Patent Document 1
  Japanese Patent Application Publication No. 2001-506044

SUMMARY OF THE INVENTION

Problem to Be Solved by the Invention

However, since the set TFT (T2) and the set TFT (T4) are in diode connection in the unit shift register circuit disclosed in Patent Document 1, a precharge voltage of the output TFT decreases by the threshold voltage of the set TFT, and thus there is a problem of progressing characteristics degradation.

In addition, since switching operations are possible in bi-directional shift operations, two sets of set TFTs and reset TFTs are necessary, which causes a problem that the number of circuit elements increases.

The some aspects of the present invention aim to provide a unit shift register circuit, a shift register circuit, a control method for the unit shift register circuit, and a display device which can reduce the influence of characteristics degradation and perform bi-directional shift operations with a fewer number of circuit elements.

Means for Solving the Problems

A unit shift register circuit of one aspect of the present invention is the unit shift register circuit constituting each stage of a shift register circuit, the unit shift register circuit including: a first transistor that includes a first gate terminal, a first source terminal, and a first drain terminal, inputs a predetermined clock signal to the first drain terminal, and outputs an output signal from the first source terminal; a second transistor that includes a second gate terminal, a second source terminal, and a second drain terminal, the second source terminal being connected to the first gate terminal of the first transistor, inputs a first input signal to the second drain terminal, and inputs a second input signal to the second gate terminal; and a third transistor that includes a third gate terminal, a third source terminal, and a third drain terminal, the third source terminal being connected to the first gate terminal of the first transistor, inputs a third input signal to the third drain terminal, and inputs a fourth input signal to the third gate terminal, wherein, in a forward shift operation, the second input signal having a higher voltage than a voltage of the first input signal is input to the second gate terminal in a case that the first gate terminal of the first transistor is charged, and the fourth input signal having a higher voltage than a voltage of the third input signal is input to the third gate terminal in a case that the first gate terminal of the first transistor is discharged, and wherein, in a backward shift operation, the fourth input signal having a higher voltage than a voltage of the third input signal is input to the third gate terminal in a case that the first gate terminal of the first transistor is charged, and the second input signal having a higher voltage than a voltage of the first input signal is input to the second gate terminal in a case that the first gate terminal of the first transistor is discharged.

In addition, the unit shift register circuit of one aspect of the present invention may be the unit shift register circuit, wherein the first input signal is an output signal of the unit shift register circuit at a preceding stage of the unit shift register circuit, wherein the second input signal is a signal of the first gate terminal of the first transistor of the unit shift register circuit of the stage before the preceding stage of the unit shift register circuit, wherein the third input signal is an output signal of the unit shift register circuit at a subsequent stage of the unit shift register circuit, and wherein the fourth input signal is a signal of the first gate terminal of the first transistor of the unit shift register circuit of the stage after the subsequent stage of the unit shift register circuit.

In addition, the unit shift register circuit of one aspect of the present invention may be the unit shift register circuit, wherein the first input signal is a clock signal whose cycle deviates backward from the clock signal by ¼ of a cycle in a forward shift operation and whose cycle deviates forward from the clock signal by ¼ of a cycle in a backward shift operation, wherein the second input signal is a signal of the first gate terminal of the first transistor of the unit shift register circuit of the stage before the preceding stage of the unit shift register circuit, wherein the third input signal is a clock signal whose cycle deviates forward from the clock signal by ¼ of a cycle in a forward shift operation and whose cycle deviates backward from the clock signal by ¼ of a cycle in a backward shift operation, and wherein the fourth input signal is a signal of the first gate terminal of the first transistor of the unit shift register circuit of the stage after the subsequent stage of the unit shift register circuit.

In addition, the unit shift register circuit of one aspect of the present invention may be the unit shift register circuit, in a forward shift operation, in a case that the second transistor charges the first gate terminal of the first transistor, the first input signal and the second input signal rise, and after the first gate terminal is charged, a voltage of the second input signal falls earlier than a fall of a voltage of the first input signal, and wherein, in a backward shift operation, in a case that the third transistor charges the first gate terminal of the first transistor, the third input signal and the fourth input signal rise, and after the first gate terminal is charged, a voltage of the fourth input signal falls earlier than a fall of a voltage of the third input signal.

In addition, the unit shift register circuit of one aspect of the present invention may be the unit shift register circuit, wherein the first transistor boosts the output signal through a bootstrap operation of boosting a voltage of the first gate terminal using a voltage charged in a parasitic capacitance between the first source terminal and the first gate terminal.

In addition, the unit shift register circuit of one aspect of the present invention may be the unit shift register circuit, wherein, in a forward shift operation, in a case that the third transistor discharges the first gate terminal of the first transistor, the third input signal and the fourth input signal rise, and after the first gate terminal is discharged, a voltage of the third input signal falls earlier than a fall of a voltage of the fourth input signal, and wherein, in a backward shift operation, in a case that the second transistor discharges the first gate terminal of the first transistor, the first input signal and the second input signal rise, and after the first gate terminal is discharged, a voltage of the first input signal falls earlier than a fall of a voltage of the second input signal.

In addition, the unit shift register circuit of one aspect of the present invention may be the unit shift register circuit including: a capacitive element connected between the first gate terminal and the first source terminal of the first transistor.

In addition, the unit shift register circuit of one aspect of the present invention may be the unit shift register circuit including: a pull-down circuit that pulls down an output signal of the unit shift register circuit in accordance with a clock signal having an opposite phase to the clock signal.

In addition, the unit shift register circuit of one aspect of the present invention may be the unit shift register circuit including: a transistor that connects the first gate terminal and the first source terminal of the first transistor in accordance with the clock signal.

In addition, the unit shift register circuit of one aspect of the present invention may be the unit shift register circuit including: a pull-down circuit that pulls down the first gate terminal of the first transistor in accordance with a voltage of the first gate terminal.

In addition, the unit shift register circuit of one aspect of the present invention may be the unit shift register circuit, wherein the pull-down circuit includes an inverter circuit that includes the first gate terminal as an input and a transistor of which a gate receives input of the output of the inverter circuit and a drain terminal is connected to the first gate terminal, and pulls down the first gate terminal in accordance with a voltage of the first gate terminal.

In addition, the unit shift register circuit of one aspect of the present invention may be the unit shift register circuit including: a pull-down circuit that pulls down the first gate terminal of the first transistor in accordance with a clock signal having an opposite phase to the clock signal and a voltage of the first gate terminal.

In addition, the unit shift register circuit of one aspect of the present invention may be the unit shift register circuit, wherein the pull-down circuit includes a push-pull circuit for the clock signal and a clock signal having an opposite phase, a transistor of which a gate terminal receives input of the first gate terminal that pulls down an output node of the push-pull circuit, and a transistor of which a gate receives input of the output node of the push-pull circuit and a drain terminal is connected to the first gate terminal, and the first gate terminal is pulled down in accordance with a voltage of the first gate terminal.

In addition, the unit shift register circuit of one aspect of the present invention may be the unit shift register circuit including: a transistor that is connected to the second transistor in parallel, of which a gate receives input of a clock signal of which a cycle deviates backward from the clock signal by ¼ of a cycle in a forward shift operation and a cycle deviates forward from the clock signal by ¼ of a cycle in a backward shift operation; and a transistor that is connected to the third transistor in parallel, of which a gate receives input of a clock signal of which a cycle deviates forward from the clock signal by ¼ of a cycle in a forward shift operation and a cycle deviates backward from the clock signal by ¼ of a cycle in a backward shift operation.

In addition, the unit shift register circuit of one aspect of the present invention may be the unit shift register circuit including: a pull-down circuit that pulls down an output signal of the unit shift register circuit and the first gate terminal of the first transistor in accordance with a predetermined clear signal.

In addition, the unit shift register circuit of one aspect of the present invention may be the unit shift register circuit, wherein a transistor connected to the gate terminal of the first transistor is constituted by a plurality of transistors in cascode connection.

In addition, the unit shift register circuit of one aspect of the present invention may be the unit shift register circuit including: a pull-down circuit that pulls down an output signal of the unit shift register circuit with respect to the clock signal in accordance with a clock signal having an opposite phase to the clock signal.

In addition, the unit shift register circuit of one aspect of the present invention may be the unit shift register circuit, wherein at least the first transistor, the second transistor, and the third transistor include an oxide semiconductor in a semiconductor layer.

In addition, the unit shift register circuit of one aspect of the present invention may be the unit shift register circuit, wherein the oxide semiconductor is indium gallium zinc oxide (an In—Ga—Zn—O-based semiconductor; an oxide semiconductor containing indium (In), gallium (Ga), zinc (Zn), and oxygen (O)).

In addition, the unit shift register circuit of one aspect of the present invention may be the unit shift register circuit, wherein the oxide semiconductor has crystallinity.

In addition, in the shift register circuit of one aspect of the present invention, the above-described unit shift register circuits may be connected to each other in multiple stages.

In addition, the unit shift register circuit of one aspect of the present invention may be the unit shift register circuit, wherein 4-phase clock signals are sequentially input as the clock signals to the unit shift register circuits of the respective stages with cycles deviating by ¼ of a cycle from one another.

In addition, the unit shift register circuit of one aspect of the present invention may be the unit shift register circuit, wherein an order in which the clock signal is input and an order in which the second input signal and the fourth input signal are input to the unit shift register circuits of the respective stages are switched in a forward shift operation and a backward shift operation.

In addition, a control method of one aspect of the present invention is the control method for a unit shift register circuit that constitutes each stage of a shift register circuit, wherein the unit shift register circuit includes, a first transistor that includes a first gate terminal, a first source terminal, and a first drain terminal, inputs a predetermined clock signal to the first drain terminal, and outputs an output signal from the first source terminal; a second transistor that includes a second gate terminal, a second source terminal, and a second drain terminal, the second source terminal being connected to the first gate terminal of the first transistor, inputs a first input signal to the second drain terminal, and inputs a second input signal to the second gate terminal; and a third transistor that includes a third gate terminal, a third source terminal, and a third drain terminal, the third source terminal being connected to the first gate terminal of the first transistor, inputs a third input signal to the third drain terminal, and inputs a fourth input signal to the third gate terminal, wherein, in a forward shift operation, the second input signal having a higher voltage than a voltage of the first input signal is input to the second gate terminal in a case that the first gate terminal of the first transistor is charged, and the fourth input signal having a higher voltage than a voltage of the third input signal is input to the third gate terminal in a case that the first gate terminal of the first transistor is discharged, and wherein, in a backward shift operation, the fourth input signal having a higher voltage than a voltage of the third input signal is input to the third gate terminal in a case that the first gate terminal of the first transistor is charged, and the second input signal having a higher voltage than a voltage of the first input signal is input to the second gate terminal in a case that the first gate terminal of the first transistor is discharged.

In addition, a display device of one aspect of the present invention is the display device including: a plurality of pixels; a plurality of scanning lines to which the plurality of pixels are connected; and a plurality of unit shift register circuits respectively constituting stages of a shift register circuit, each of the plurality of unit shift register circuits including: a first transistor that includes a first gate terminal, a first source terminal, and a first drain terminal, inputs a predetermined clock signal to the first drain terminal, and outputs an output signal from the first source terminal; a second transistor that includes a second gate terminal, a second source terminal, and a second drain terminal, the second source terminal being connected to the first gate terminal of the first transistor, inputs a first input signal to the second drain terminal, and inputs a second input signal to the second gate terminal; and a third transistor that includes a third gate terminal, a third source terminal, and a third drain terminal, the third source terminal being connected to the first gate terminal of the first transistor, inputs a third input signal to the third drain terminal, and inputs a fourth input signal to the third gate terminal, wherein, in a forward shift operation, the second input signal having a higher voltage than a voltage of the first input signal is input to the second gate terminal in a case that the first gate terminal of the first transistor is charged, and the fourth input signal having a higher voltage than a voltage of the third input signal is input to the third gate terminal in a case that the first gate terminal of the first transistor is discharged, and wherein, in a backward shift operation, the fourth input signal having a higher voltage than a voltage of the third input signal is input to the third gate terminal in a case that the first gate terminal of the first transistor is charged, and the second input signal having a higher voltage than a voltage of the first input signal is input to the second gate terminal in a case that the first gate terminal of the first transistor is discharged.

Effect of the Invention

According to some aspect of the present invention, when a unit shift register circuit is caused to perform a forward shift operation, a second transistor can be set as a set transistor and a third transistor can be set as a reset transistor, and when the unit shift register circuit is caused to perform a backward shift operation, the third transistor can be set as a set transistor and the second transistor can be set as a reset transistor. In addition, when the unit shift register circuit is caused to perform a forward shift operation, a first input signal and a second input signal that are different from each other (a voltage of the first input signal<a voltage of the second input signal) are input to a second source terminal and a second gate terminal of the second transistor serving as a set transistor, and thus a first gate terminal of the first transistor serving as an output transistor can be charged (i.e., precharged). In addition, when the unit shift register circuit is caused to perform a backward shift operation, a third input signal and a fourth input signal that are different from each other (a voltage of the third input signal<a voltage of the fourth input signal) are input to a third source terminal and a third gate terminal of the third transistor serving as a set transistor, and thus the first gate terminal of the first transistor serving as an output transistor can be charged. In this case, for the second input signal or the fourth input signal, for example, a signal of a first gate terminal of an output transistor of another unit shift register circuit can be used, and thus, the precharge voltage of the output transistor does not decrease by a threshold voltage of the set transistor. Therefore, the influence caused by characteristics degradation can be reduced.

In addition, since two pairs of set TFTs and reset TFTs are not necessary to enable a switching operation in a bi-directional shift operation, the number of circuit elements can be fewer. Therefore, according to the unit shift register circuit of some aspect of the present invention, a unit shift register circuit which can easily reduce the influence caused by characteristics degradation with a fewer number of circuit elements and enables bi-directional shift operations can be provided.

BRIEF DESCRIPTIONS OF THE DRAWINGS

EMBODIMENTS FOR CARRYING OUT THE INVENTION

Embodiments of the present invention will be described with reference to the accompanying diagrams hereinbelow.

First Embodiment

Figure 1:
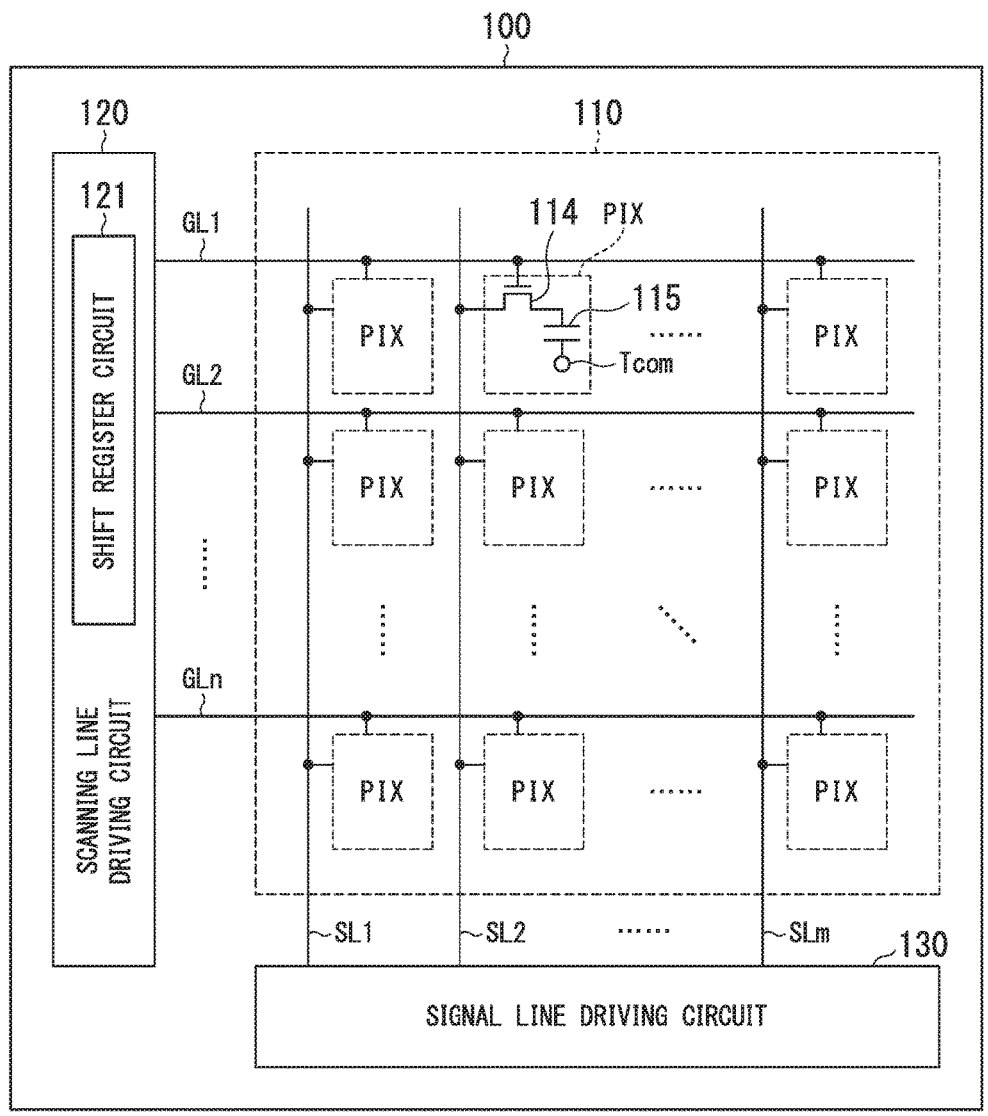
FIG. 1 is a conceptual diagram showing a configuration example of a liquid crystal display device according to an embodiment of the present invention.

First, a configuration example of a liquid crystal display device according to an embodiment of the present invention will be described using FIG. 1. FIG. 1 is a conceptual diagram showing a configuration example of a liquid crystal display device according to an embodiment of the present invention. The active matrix type liquid crystal display device 100 shown in FIG. 1 includes a plurality of signal lines SL1, SL2, . . . , and SLm, a plurality of scanning lines GL1, GL2, . . . , and GLn, and a plurality of pixel units PIX that are provided to correspond to each other at intersections of the plurality of signal lines SL1, SL2, . . . , and SLm and the plurality of scanning lines GL1, GL2, . . . , and GLn (which are collectively referred to as GLs). The pixel units PIX are arrayed in a matrix shape and constitute a display region 110. Each of the pixel units PIX includes a thin film transistor (TFT) 114 serving as a switching element of which a gate terminal is connected to a scanning line passing through a corresponding intersection and a source terminal is connected to a signal line passing through the intersection, a pixel capacitor 115 of which one end is connected to a common substrate Tcom for holding video signals, and the like. In addition, the liquid crystal display device 100 includes a signal line driving circuit 130 which drives the signal lines SL1, SL2, . . . , and SLm and a scanning line driving circuit 120 which drives the scanning lines GL1, GL2, . . . , and GLn. The scanning line driving circuit 120 includes a shift register circuit 121, and the shift register circuit 121 generates driving signals of each of the scanning lines GL1, GL2, . . . , and GLn.

Figure 2:
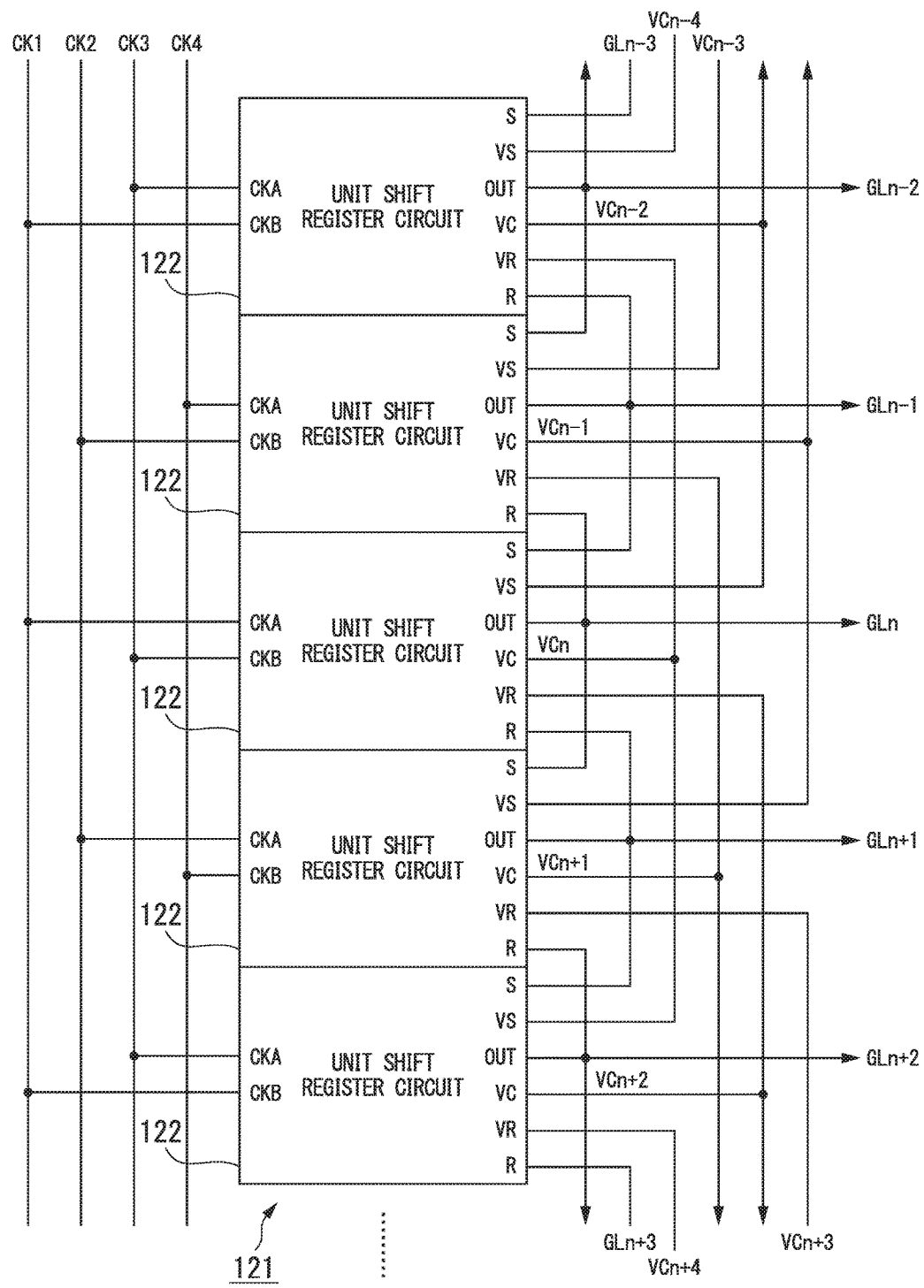
FIG. 2 is a block diagram showing a configuration example of a shift register circuit (a first embodiment) according to the present invention.

Next, a configuration example of the shift register circuit 121 shown in FIG. 1 will be described with reference to FIGS. 2 and 3. FIG. 2 is a block diagram showing a configuration example of the shift register circuit (a first embodiment) according to the present invention. Although FIG. 2 shows 5 unit shift register circuits 122 included in the shift register circuit 121 shown in FIG. 1 and input and output signal lines thereof, this number is an example.

In the configuration example shown in FIG. 2, the shift register circuit 121 is configured in a plurality of stages in cascade connection (i.e., multi-stage connection). A unit shift register circuit 122 constituting each stage has a clock terminal CKA, a clock terminal CKB, a terminal S, a terminal VS connected to a gate terminal of a transistor T2, an output terminal OUT, a terminal VC connected to a node VC, a terminal VR connected to a gate terminal of a transistor T3, and a terminal R. Note that, in the following description, the name of a signal input to and output from each terminal is set to have the same name as the terminal, and the name of a node connected to each terminal is set to have a name shared with the terminal. In FIG. 2, the scanning lines GLn−3, GLn−2, GLn−1, GLn, GLn+1, GLn+2 and GLn+3 connected to the output terminals OUT, the terminals R, and the terminals S correspond to 7 consecutively arranged scanning lines among the plurality of scanning lines GL shown in FIG. 1. In addition, the suffixes such as "n−3," "n," and the like each indicate a "stage number" of a unit shift register circuit 122 that outputs it. In the example shown in FIG. 2, with reference to the central unit shift register circuit 122 set as an n stage, the 2 upper unit shift register circuits 122 are set as an n−2 stage and an n−1 stage in order from above, and the 2 lower unit shift register circuits 122 are set as an n+1 stage and an n+2 stage in order from above. In addition, with respect to the n stage, the n−2 stage and the n−1 stage will be referred to as the stage before the preceding stage (or the preceding-by-2-stages stage) and the preceding stage respectively, and the n+1 stage and the n+2 stage will be referred to as the subsequent stage and the stage after the subsequent stage, respectively. In addition, the n+1 stage, the n+2 stage, and the like will be collectively referred to as stages subsequent to the n stage. Further, VCn−4, VCn−3, VCn−2, VCn−1, VCn, VCn+1, VCn+2, VCn+3, and VCn+4 are output signals of the terminals VC of the unit shift register circuits 122 in the n−4, n−3, n−2, n−1, n, n+1, n+2, n+3, and n+4 stages respectively. Furthermore, for the unit shift register circuits 122 that can perform bi-directional shift operations, a shift operation performed in the direction from a preceding stage to a subsequent stage will be referred to as a forward (FWD) shift operation, and a shift operation performed in the direction from a subsequent stage to a preceding stage will be referred to as a backward (BWD) shift operation.

With respect to a unit shift register circuit 122 in an N-th stage, an output GLn−1 of a preceding stage is input as a signal S that is an input signal of the terminal S of the N-th stage, an output VCn−2 of the stage before the preceding stage this is input as a signal VS that is an input signal of the terminal VS of the N-th stage, an output GLn+1 of the subsequent stage is input as a signal R that is an input signal of the terminal R of the N-th stage, and an output VCn+2 of the stage after the subsequent stage is input as a signal VR that is an input signal of the terminal VR of the N-th stage.

A clock signal CKA (a predetermined clock signal) input to the clock terminal CKA and a clock signal CKB input to the clock terminal CKB are 4-phase clock signals, and connection of CKA=CK1 and CKB=CK3, CKA=CK2 and CKB=CK4, CKA=CK3 and CKB=CK1, CKA=CK4 and CKB=CK2, CKA=CK1 and CKB=CK3, CKA=CK2 and CKB=CK4, . . . are made in this order at the respective 4 stages of the unit shift register circuits 122. Here, the clock signal CKA and the clock signal CKB are clock signals having opposite phases to each other.

Figure 3:
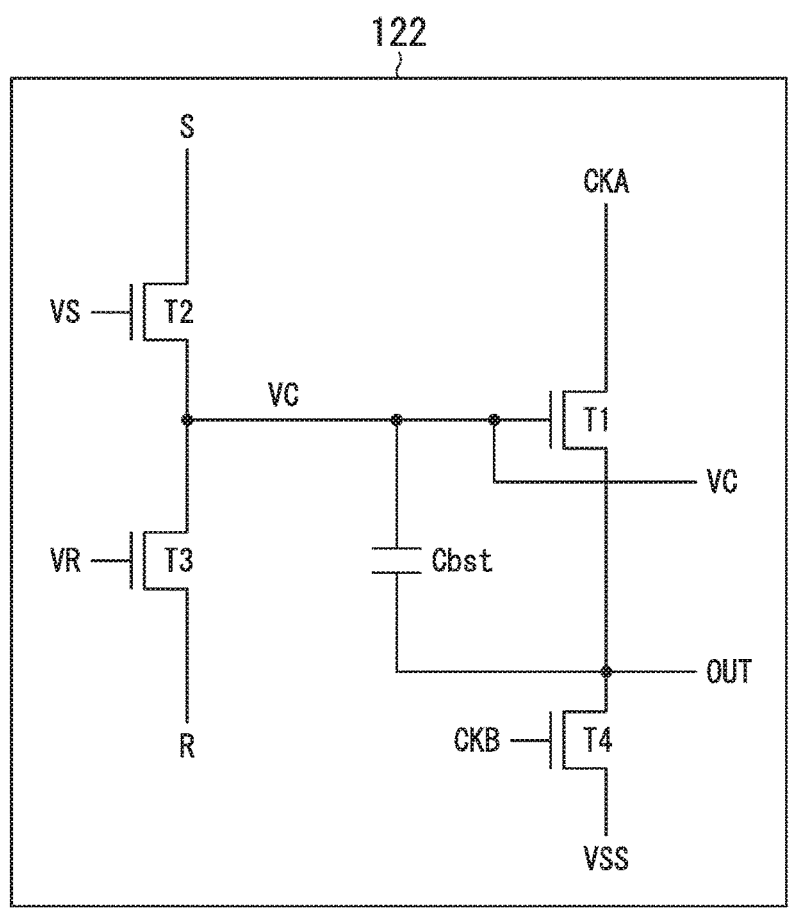
FIG. 3 is a block diagram showing a configuration example of a unit shift register circuit (the first embodiment) according to the present invention.

FIG. 3 is a block diagram showing a configuration example of the unit shift register circuit (the first embodiment) according to the present invention.

As shown in FIG. 3, the unit shift register circuit 122 is constituted by a TFT T1 (which will be referred to as a "transistor T1" or simply as a "T1" below (the same applies to other TFTs)) and a TFT T4 that are connected to GLs (OUT) each of which drives a scanning line, and transistors T2 and T3 that are connected to a node VC which is a gate terminal of the T1. A gate terminal of the T2 is connected to a signal VS, and a drain terminal thereof is connected to a signal S. In addition, a gate terminal of the T3 is connected to a signal VR, and a drain terminal thereof is connected to a signal R. Note that the transistors T1 to T4 are N-channel TFTs (thin film transistors).

The T1 is an output transistor for outputting a pulse signal to an output terminal OUT. The T1 has a drain terminal (a first drain terminal) connected to a clock terminal CKA, a gate terminal (a first gate terminal) connected to the node VC, and a source terminal (a first source terminal) connected to the output terminal OUT. The T1 performs an operation of boosting the output signal OUT by performing a bootstrap operation of boosting a gate voltage with a voltage charged to a capacitor Cbst (a capacitive element) positioned between the source terminal and the gate terminal shown in FIG. 3. Note that the capacitor Cbst may be a parasitic capacitor, or may be a capacitor provided between the source terminal and the gate terminal. The capacitor Cbst between the source terminal and the gate terminal works as a boost capacitor during a bootstrap operation. Thus, boosting efficiency can be increased and a driving force can be improved. In addition, it works to stabilize a potential of the node VC (i.e., to prevent oscillation) during a non-selection operation, and thus can prevent floating of the node VC caused by coupling with a pulse of CKA.

The T2 has the gate terminal (a second gate terminal) connected to the terminal VS, the drain terminal (a second drain terminal) connected to the terminal S, and a source terminal (a second source terminal) connected to the node VC. The T2 serves as a set TFT during a FWD operation (during FED scanning).

The T2 performs a set operation in a set operation (precharge of the node VC (charge of the gate terminal of the T1)) by inputting an input signal VS having a higher voltage than the input signal S of the terminal S (e.g., a sufficiently high voltage with which a threshold voltage can be secured even when the T2 deteriorates) to the terminal VS. Accordingly, the input voltage of the terminal S can be supplied to the node VC as it is. In addition, the T2 serves as a reset TFT in a BWD operation (in BWD scanning). The T2 performs a reset operation in a reset operation (pull-down of the node VC (discharge of the gate terminal of the T1)) by inputting the input signal VS having a higher voltage than the input signal S of the terminal S to the terminal VS.

The T3 has a gate terminal (a third gate terminal) connected to a terminal VR and a drain terminal (a third drain terminal) connected to a terminal R, and a source terminal (a third source terminal) connected to the node VC. The T3 serves as a reset TFT in a FWD operation (in FWD scanning). The T3 performs a reset operation by inputting an input signal VR having a higher voltage than an input signal R of the terminal R to the terminal VR in a reset operation. In addition, the T3 serves as a set TFT in a BWD operation (in BWD scanning). The T3 performs a set operation by inputting an input signal VR having a higher voltage (e.g., a sufficiently high voltage which can secure a threshold voltage even when the T3 deteriorates) than the input signal R of the terminal R to the terminal VR in a set operation. Accordingly, an input voltage of the terminal R can be supplied to the node VC as it is.

The T4 has a gate connected to a clock terminal CKB, a drain connected to an output terminal OUT, and a source connected to a terminal VSS (i.e., a power source voltage VSS). The power source voltage VSS is a voltage serving as a reference in operations of the unit shift register circuit 122. The T4 works as a TFT that pulls down the output terminal OUT (a scanning line GL) with the CKB having an opposite phase to the CKA. That is, since the output terminal OUT is pulled down by a CKB signal during non-selection (i.e., a period in which the T1 does not output an output signal OUT), noise such as floating of the GL is reduced.

Note that, for example, the configuration shown in FIG. 3 and the configuration of the present invention described in the claims have the following relationship. The transistor T1 is one of configuration examples of the "first transistor." The transistor T2 is one of configuration examples of the "second transistor." The transistor T3 is one of configuration examples of the "third transistor." The signal S input to the terminal S corresponds to the "first input signal," the signal VS input to the terminal VS corresponds to the "second input signal," the signal R input to the terminal R corresponds to the "third input signal," and the signal VR input to the terminal VR corresponds to the "fourth input signal."

Figure 4:
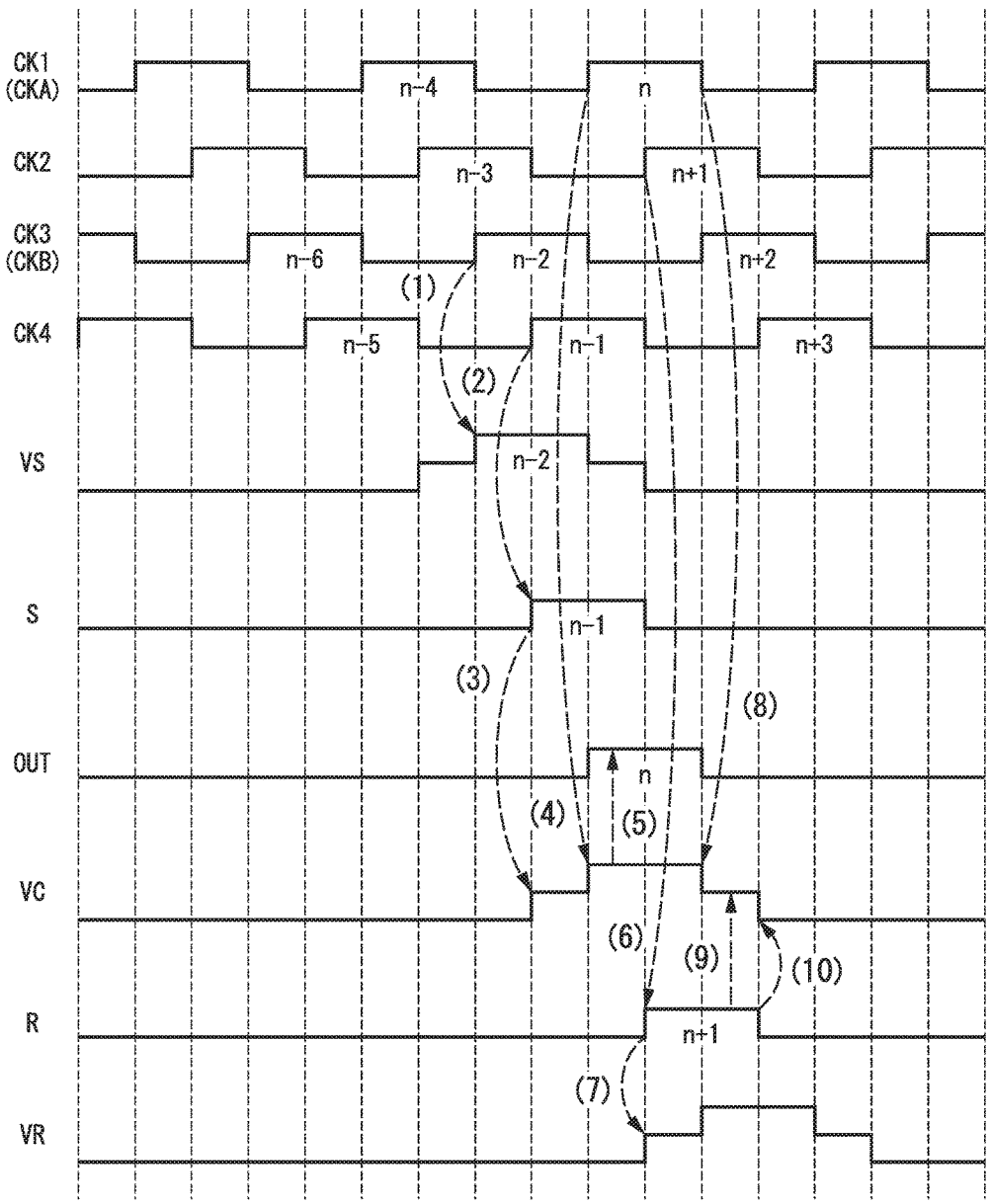
FIG. 4 is a timing chart of a FWD direction operation of the unit shift register circuit 122 shown in FIG. 3 (the first embodiment).

Next, an operation example of the unit shift register circuit 122 shown in FIG. 3 will be described with reference to FIGS. 4 and 5. FIG. 4 is a timing chart of a FWD direction operation of the unit shift register circuit 122 shown in FIG. 3 (the first embodiment). FIG. 4 is a timing chart showing an operation example of the unit shift register circuit 122 in the n-th stage. 4-phase clocks CK1 to 4 are sequentially input to the unit shift register circuits 122 at the respective stages in their cycles that deviate by ¼ of a cycle from one another to drive the unit shift register circuits 122. In FIG. 4, "n−6" to "n+3," which are numbers shown for the clock signals CK1 to CK4, indicate the stage numbers of the unit shift register circuits 122 in which their corresponding pulses work as clock signals. In other words, the numbers indicate the stage numbers of the unit shift register circuits 122 sequentially selected in the FWD direction operation to output an output signal OUT using a corresponding clock signal CK.

Driving of the unit shift register circuit 122 of the N (=n)-th stage is performed as follows.

The unit shift register circuit 122 of the stage before the preceding stage operates and a (voltage of) a boosted node VCn−2 is input to the terminal VS at the time indicated by (1) and its relevant dotted arrow in FIG. 4.

Next, the unit shift register circuit 122 of the preceding stage operates at the timing indicated by (2) in FIG. 4, and an output of GLn−1 is input to the terminal S.

Here, VS is a boosted voltage, and the node VC is charged with an input signal from S as it is at the timing indicated by (3) in FIG. 4.

Next, when a pulse of CK1 is given in a state in which the gate terminal of the T1 is charged at the timing indicated by (4) in FIG. 4, the node VC is boosted through a bootstrap operation and has a high potential.

Here, since the node VC is boosted to have a sufficiently high voltage at the timing indicated by (5) in FIG. 4, the pulse of the CK is output to the output terminal OUT, i.e., GLn.

At the same time, an output OUT is input to the terminal S of the subsequent stage at the timing indicated by (6) in FIG. 4, and an output of the subsequent stage is output to GLn+1 due to a rise of CK2.

The node VC of the stage after the subsequent stage is further precharged by GLn+1 at the timing indicated by (7) in FIG. 4.

The pulse of CK1 falls, the output OUT is pulled down, and the voltage of the node VC decreases to the value before the boosting at the timing indicated by (8) in FIG. 4.

When VR is boosted at the timing indicated by (9) in FIG. 4, the node VC is fixed to the output from R.

When the node R is pulled down at the timing indicated by (10) in FIG. 4, the node VC is also pulled down.

In the above-described operation, when the transistor T2 charges the gate terminal of the transistor T1, the input signal S and the input signal VS rise, and after the gate terminal of the transistor T1 is charged, the voltage of the input signal VS falls earlier than a fall of the voltage of the input signal S. For this reason, it is possible to prevent a drop of the voltage of the charged gate terminal, without causing a backflow to another stage even though diode connection is not inserted. In addition, when the transistor T3 discharges the gate terminal of the transistor T1, the input signal R and the input signal VR rise, and after the gate terminal of the transistor T1 is discharged, the voltage of the input signal R falls earlier than a fall of the voltage of the input signal VR. Thus, a reliable reset operation can be executed.

Figure 5:
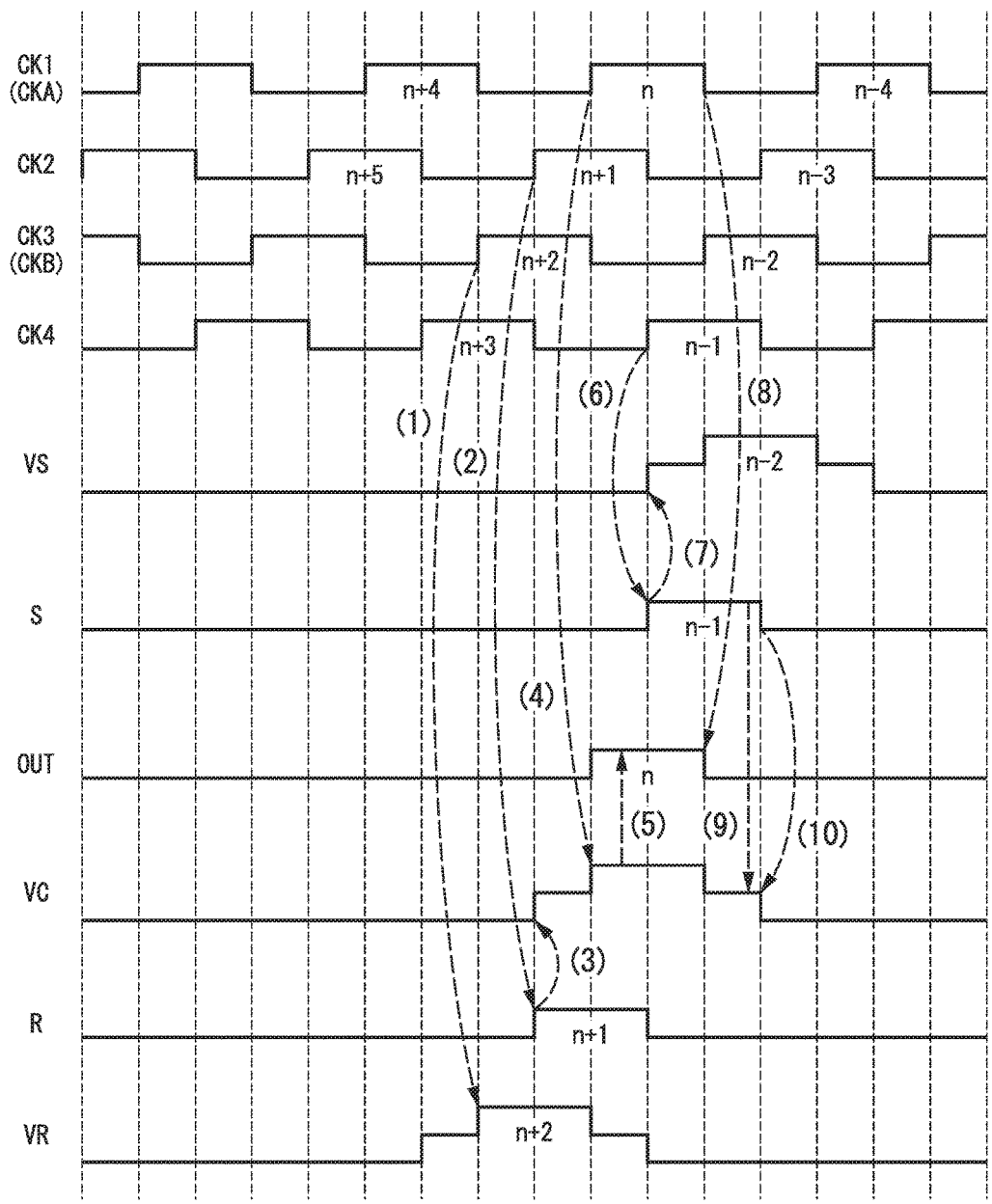
FIG. 5 is a timing chart of a BWD direction operation of the unit shift register circuit 122 shown in FIG. 3 (the first embodiment).

FIG. 5 is a timing chart of a BWD direction operation of the unit shift register circuit 122 shown in FIG. 3 (the first embodiment). FIG. 5 is a timing chart showing an operation example of the unit shift register circuit 122 of the n-th stage. The 4-phase clocks CK1 to CK4 are sequentially input to the unit shift register circuits 122 at the respective stages in their cycles that deviate by ¼ of a cycle from one another to drive the unit shift register circuits 122. In FIG. 5, "n+5" to "n−4," which are numbers shown for the clock signals CK1 to CK4, indicate the stage numbers of the unit shift register circuits 122 in which their corresponding pulses work as clock signals. In other words, the numbers indicate the stage numbers of the unit shift register circuits 122 sequentially selected in the BWD direction operation to output an output signal OUT using a corresponding clock signal CK. In addition, an order in which the clock signals are input and an order in which the input signal VS and the input signal VR are input to the unit shift register circuits in the BWD direction operation are switched from those of the FWD direction operation of the respective stages. Accordingly, a function of reversing tops and bottoms is possible with no addition of signals.

Driving of the unit shift register circuit 122 in the N (=n)-th stage is performed as follows.

The unit shift register circuit 122 of the stage after the subsequent stage operates and a boosted (voltage of) node VCn+2 is input to the terminal VR at the timing indicated by (1) and its relevant dotted arrow in FIG. 5.

Next, the unit shift register circuit 122 of the subsequent stage operates and an output of GLn+1 is input to the terminal R at the timing indicated by (2) in FIG. 5.

Here, VR is a boosted voltage, and the node VC is charged with an input signal from R as it is at the timing indicated by (3) in FIG. 5.

Next, when a pulse of CK1 is given in a state in which the gate terminal of T1 is charged, the node VC is boosted through a bootstrap operation and has a high potential at the timing indicated by (4) in FIG. 5.

Here, since the node VC is boosted to have a sufficiently high voltage at the timing indicated by (5) in FIG. 5, the pulse of the CK is output to the output terminal OUT, i.e., GLn.

At the same time, an output OUT is input to the terminal S of the preceding stage at the timing indicated by (6) in FIG. 5, and an output of the preceding stage is output to GLn−1 due to a rise of CK4.

The node VC of the stage before the preceding stage is precharged further by GLn−1 at the timing indicated by (7) in FIG. 5.

The output OUT is pulled down due to a fall of the pulse of CK1 and thus the voltage of the node VC decreases to the value before the boosting at the timing indicated by (8) in FIG. 5.

When VS is boosted at the timing indicated by (9) in FIG. 5, the node VC is fixed to an output from S.

When the terminal S is pulled down at the timing indicated by (10) in FIG. 5, the node VC is also pulled down.

In the above-described operation, when the transistor T3 charges the gate terminal of the transistor T1, the input signal R and the input signal VS rise, and after the gate terminal of the transistor T1 is charged, the voltage of the input signal VS falls earlier than a fall of the voltage of the input signal R. For this reason, it is possible to prevent a drop of the voltage of the charged gate terminal, without causing a backflow to another stage even though diode connection is not inserted. In addition, when the transistor T2 discharges the gate terminal of the transistor T1, the input signal S and the input signal VR rise, and after the gate terminal of the transistor T1 is discharged, the voltage of the input signal S falls earlier than a fall of the voltage of the input signal VS. Thus, a reliable reset operation can be executed.

As described above with reference to FIGS. 4 and 5, while the T2 operates as a set transistor and T3 operates as a reset transistor in the FWD operation, the T3 operates as a set transistor and the T2 operates as a reset transistor in the BWD operation. In other words, the FWD operation and the BWD operation can be performed by switching the pair of a set transistor and a reset transistor. Thus, according to the unit shift register circuit of one aspect of the present invention, it is possible to realize a unit shift register circuit which can perform bi-directional shift operations with a fewer number of circuit elements.

Figure 6:
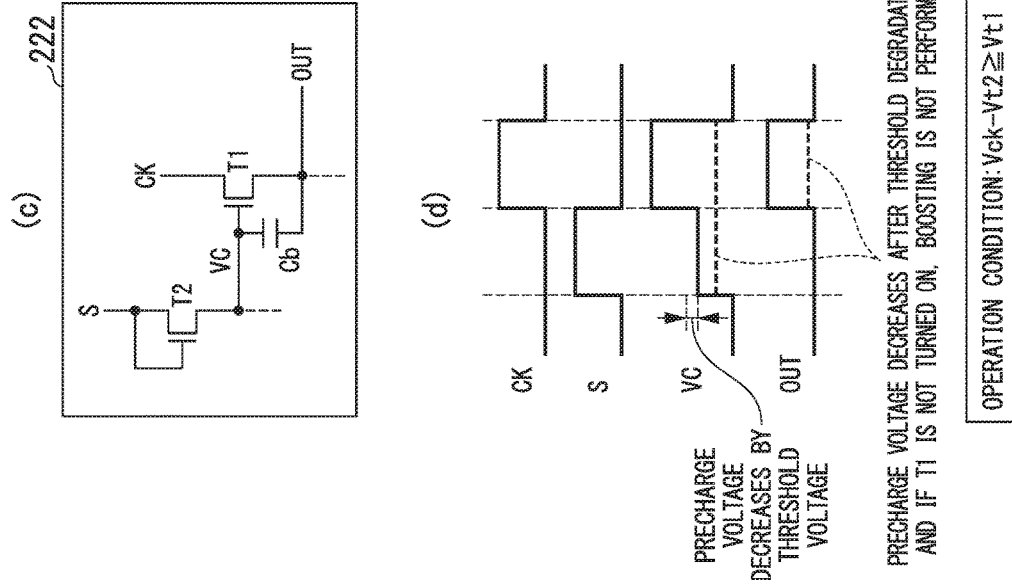
FIG. 6 is an illustrative diagram for describing an effect of the unit shift register circuit 122 (the first embodiment) according to the present invention.
Figure 6:
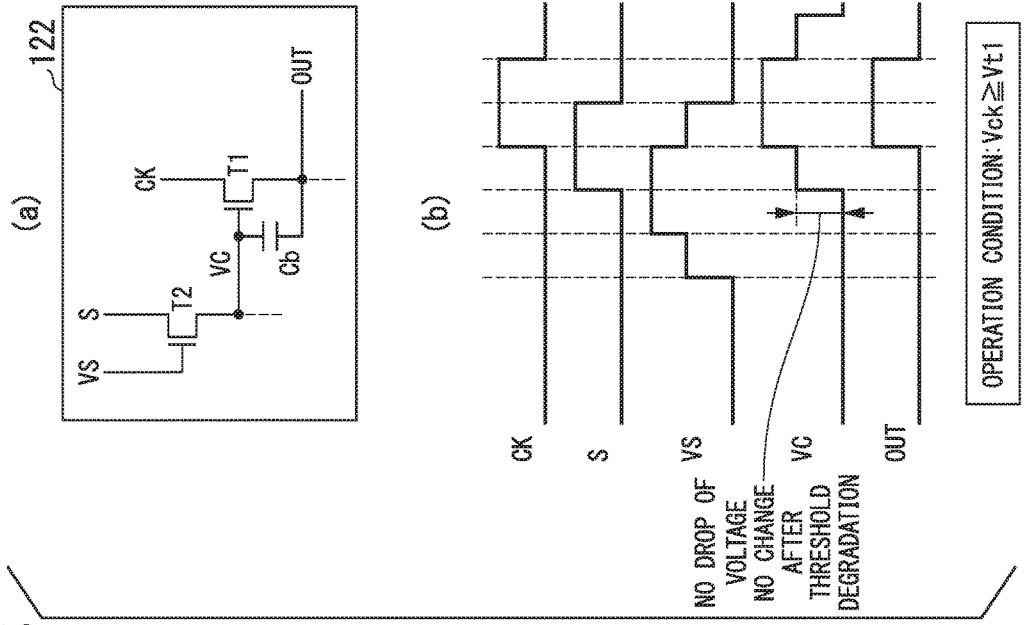
Figure 7:
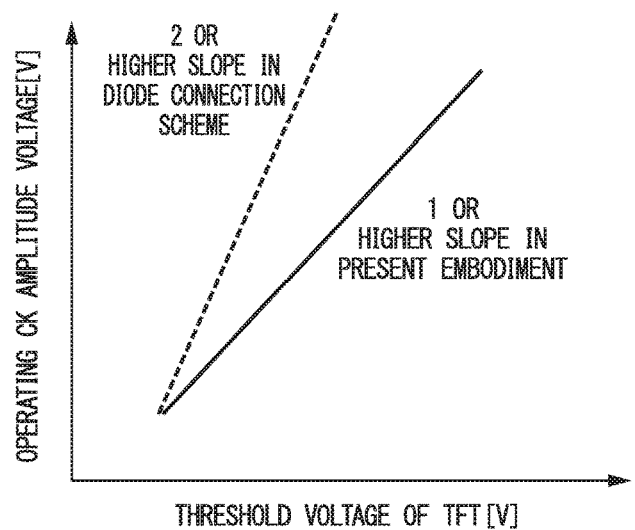
FIG. 7 is another illustrative diagram for describing an effect of the unit shift register circuit 122 (the first embodiment) according to the present invention.

Next, an effect of the first embodiment will be described with reference to FIGS. 6 and 7. FIGS. 6 and 7 are illustrative diagrams for comparing and describing configurations and effects of the present embodiment and a diode connection scheme (e.g., the same scheme as described in Patent Document 1). FIG. 6 is an illustrative diagram for describing an effect of the unit shift register circuit 122 (the first embodiment) according to the present invention. FIG. 6(a) is a configuration diagram showing a configuration of the unit shift register circuit 122 according to the present embodiment with a capacitor Cb for boosting clearly indicated. In FIG. 6(a), the same reference symbols as those of the configuration shown in FIG. 3 are used. FIG. 6(b) is a timing chart showing an operation example of the configuration shown in FIG. 6(a). Note that, although FIG. 6(b) is the same timing chart as FIG. 4, it is inserted again for comparison to the diode connection scheme. FIG. 6(c) is a configuration diagram showing a configuration example of a unit shift register circuit 222 based on the diode connection scheme. In this case, the T2 has a drain and a gate connected to a terminal S. In addition, FIG. 6(d) is a timing chart showing an operation example of the configuration shown in FIG. 6(c).

In the diode connection scheme, a voltage precharged at a node VC decreases by a threshold voltage of a transistor T2 and since it is further determined whether to turn on a transistor T1 and apply a bootstrap on the basis of the decreased voltage as shown in FIGS. 6(c) and 6(d), it is affected by a threshold shift of the T1 and the T2. In this case, if a clock amplitude of the terminal S is set to Vck and threshold voltages of the T1 and T2 are set to Vt1 and Vt2, an operation condition is Vck−Vt2≥Vt1.

On the other hand, since there is no decrease in a voltage by a threshold voltage of the transistor T2 in the present embodiment as shown in FIGS. 6(a) and 6(b), it is affected only by a threshold value of the transistor T1.

An operation condition thereof is Vck≥Vt1.

FIG. 7 is another illustrative diagram for describing an effect of the unit shift register circuit 122 (the first embodiment) according to the present invention. In FIG. 7, the horizontal axis represents threshold voltages of a TFT and the vertical axis represents amplitude voltages of an operating clock (lower limit values of amplitude voltages of CK). A relationship between the threshold voltages of the TFTs and the lower limit values of the amplitude voltages of CK can be approximated by a segment.

Since the above-described operation condition is expressed using the threshold values of the T1 and T2 in the diode connection scheme, a slope of the lower limit values of the amplitude voltages of the operating CK with respect to the threshold voltages of the TFT is 2 or higher. On the other hand, since the above-described operation condition is expressed using the threshold voltage of the T1 in the present embodiment, a slope of the lower limit values of the amplitude voltages of the operating CK with respect to the threshold voltages of the TFT decreases to 1.

Thus, it can be ascertained from the characteristics diagram shown in FIG. 7 that, when the threshold voltages of the TFT shift, the lower limit values of the amplitude voltages of CK in the present embodiment do not significantly change in comparison to the lower limit values of the amplitude voltages of CK in the diode connection scheme. In other words, an operation margin with respect to a threshold voltage shift in the present embodiment is dramatically improved in comparison to that in the diode connection scheme.

Since the operation margin improves as the lower limit values of the amplitude voltages of the CK decreases, a more highly reliable panel can be realized. Alternatively, since a driving voltage is lowered to the extent of the improvement of the operation margin, a panel that achieves lower power consumption can be realized with the reliability maintained.

The above-described comparison, however, compares theoretical limit values, and TFTs of the present embodiment and the diode connection scheme are assumed to have sufficient driving forces. In other words, unsatisfactory driving caused by insufficient capabilities is not considered.

Second Embodiment

Figure 8:
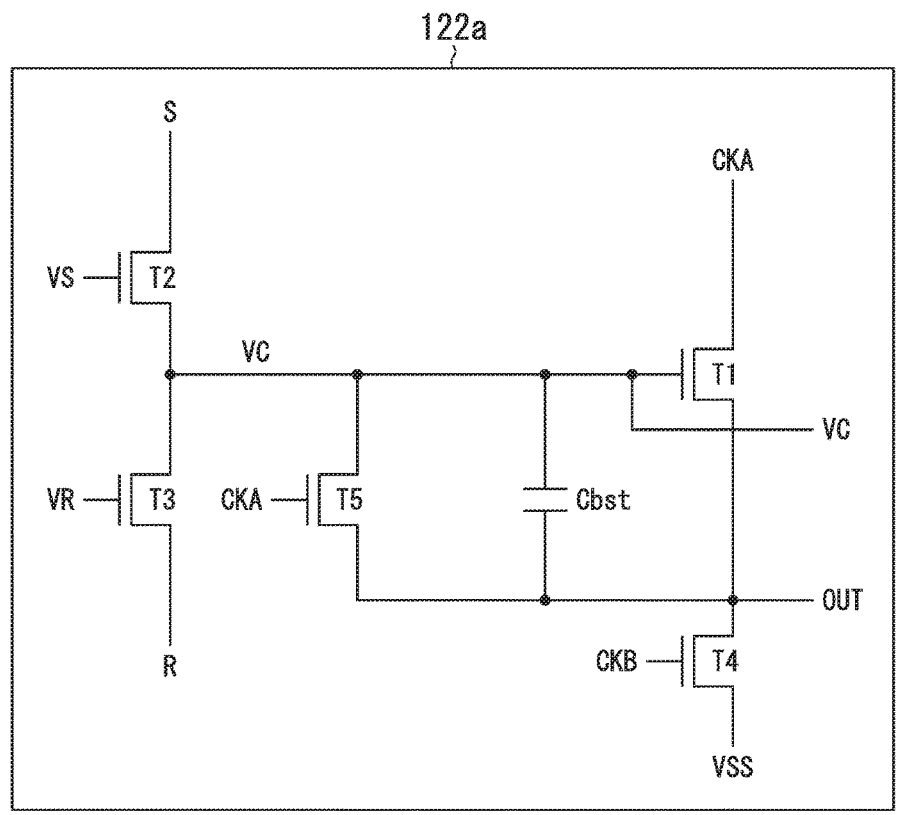
FIG. 8 is a block diagram showing a configuration example of a unit shift register circuit 122a (a second embodiment).
Figure 9:
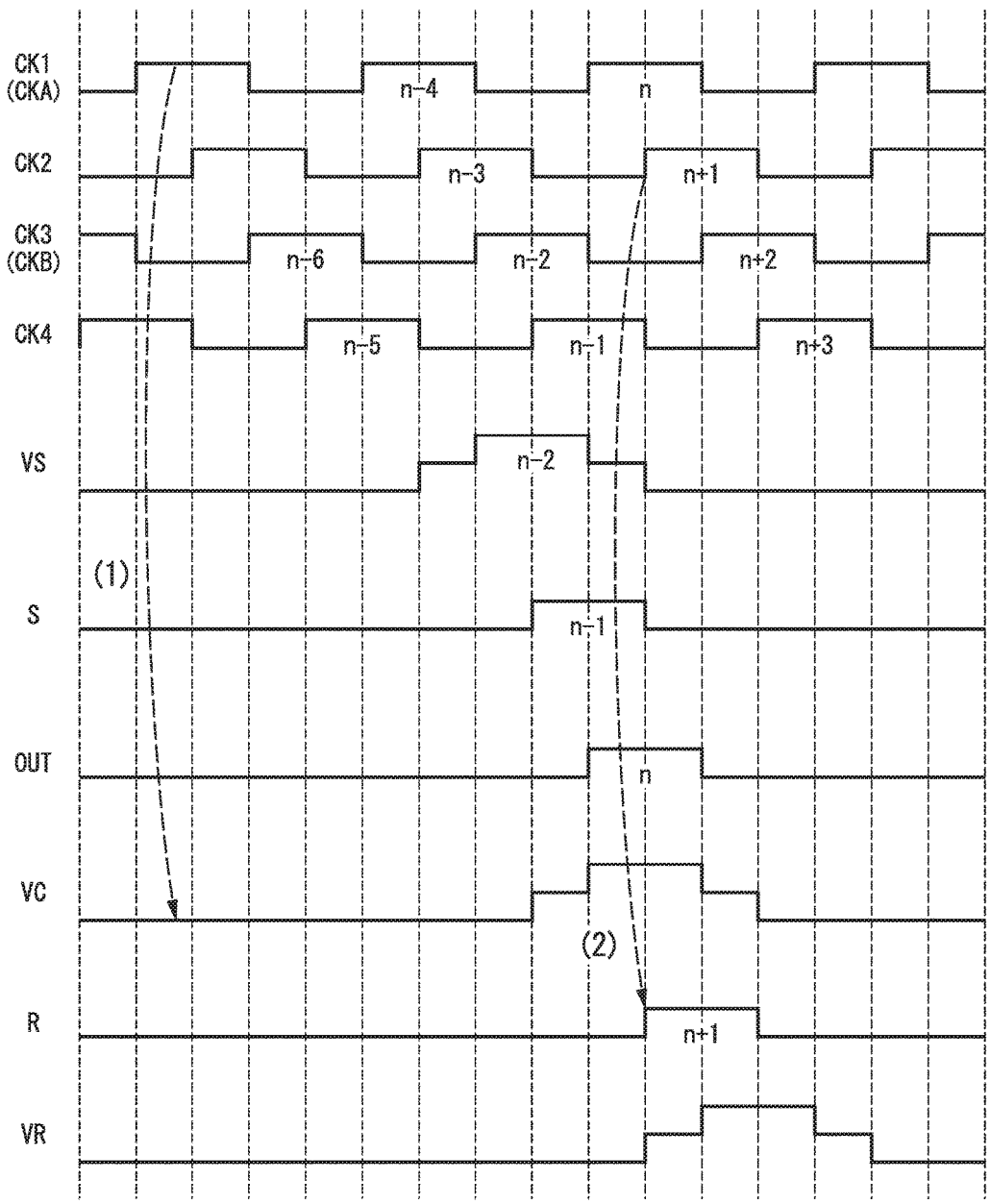
FIG. 9 is a timing chart of an operation of the unit shift register circuit 122a shown in FIG. 8 (the second embodiment).

Next, a second embodiment of the present invention will be described with reference to FIGS. 8 and 9. FIG. 8 is a block diagram showing a configuration example of a unit shift register circuit 122a (the second embodiment). In addition, FIG. 9 is a timing chart of an operation of the unit shift register circuit 122a shown in FIG. 8 (the second embodiment). As shown in FIG. 8, the unit shift register circuit 122a of the second embodiment has an additional transistor T5 for connecting an output terminal OUT and a node VC, in comparison to the unit shift register circuit 122 of the first embodiment shown in FIG. 3. The T5 is a conductive type, like the other T1 to T4. A configuration of a shift register circuit and a configuration of a liquid crystal display device in which a plurality of unit shift register circuits 122a are used are similar to those of the first embodiment.

As illustrated in FIG. 8, the unit shift register circuit 122a of the second embodiment has a circuit with a function of initializing the internal node VC configured by the T5. The T5 has a drain connected to the node VC, a gate connected to a clock signal CKA, and a source connected to the output terminal OUT.

As shown in FIG. 9, when the T1 (output OUT) is not selected (the timing indicated by (1) in FIG. 9), which is a timing of CKA=H, the T5 is turned on, causing the node VC and a node OUT in its stage to be connected. At this time, a voltage between Vg-Vs of the T1 has the same potential, and the T1 maintains an off-state.

On the other hand, when the T1 (output OUT) is selected (the timing indicated by (2) in FIG. 9), the node VC is at a high (H) level, thus the T1 is turned on with an input of the CKA, and thus the node OUT is charged. When a potential of OUT increases, the gate potential Vg and the source potential Vs of the T5 have substantially the same voltage, and thus it is in an off-state.

In the second embodiment, the internal node VC can be stabilized with only one transistor of the T5. With this circuit, by connecting the GL node to the node VC when the T1 (the output OUT) is not selected (i.e., by connecting the node OUT to the node VC via the T5), a large capacitance of the GL arises from the node VC, and floating (noise) of the node VC caused by coupling capacitance between the VC and the CKA of the T1, i.e., the gate and the drain of the T1, can be suppressed. In other words, floating of the node VC caused by coupling can be completely prevented with a pulse of the CKA, and clock noise resulting from output of noise of the CKA to the GL can be suppressed.

Third Embodiment

Figure 10:
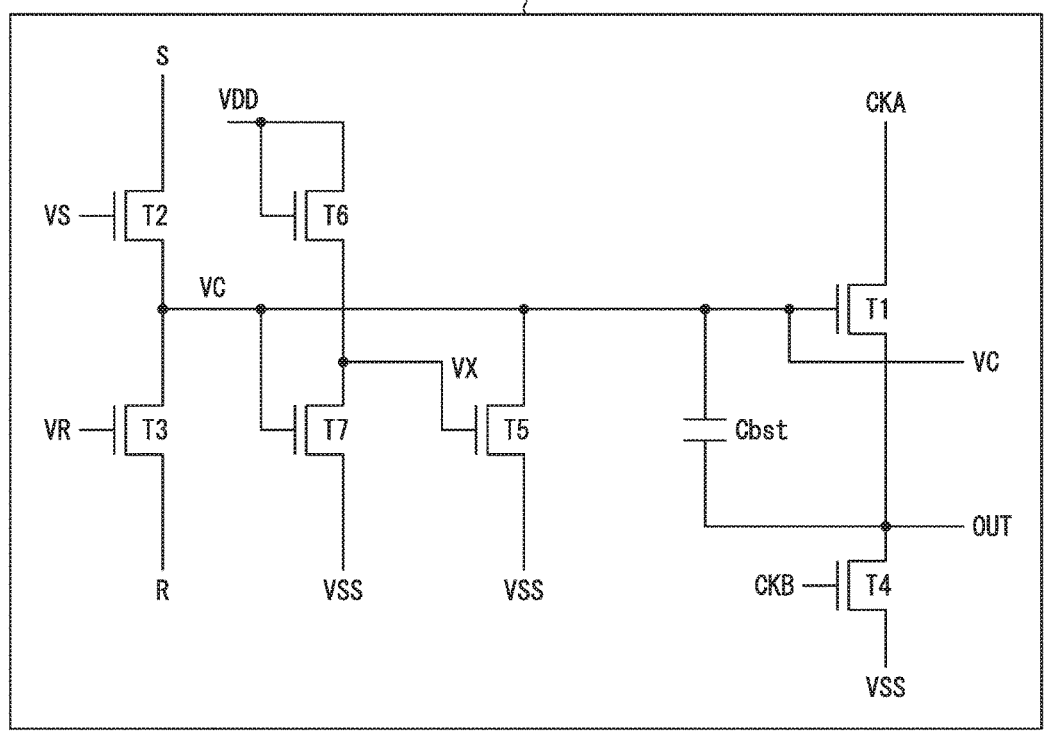
FIG. 10 is a block diagram showing a configuration example of a unit shift register circuit 122b (a third embodiment) according to the present invention.
Figure 11:
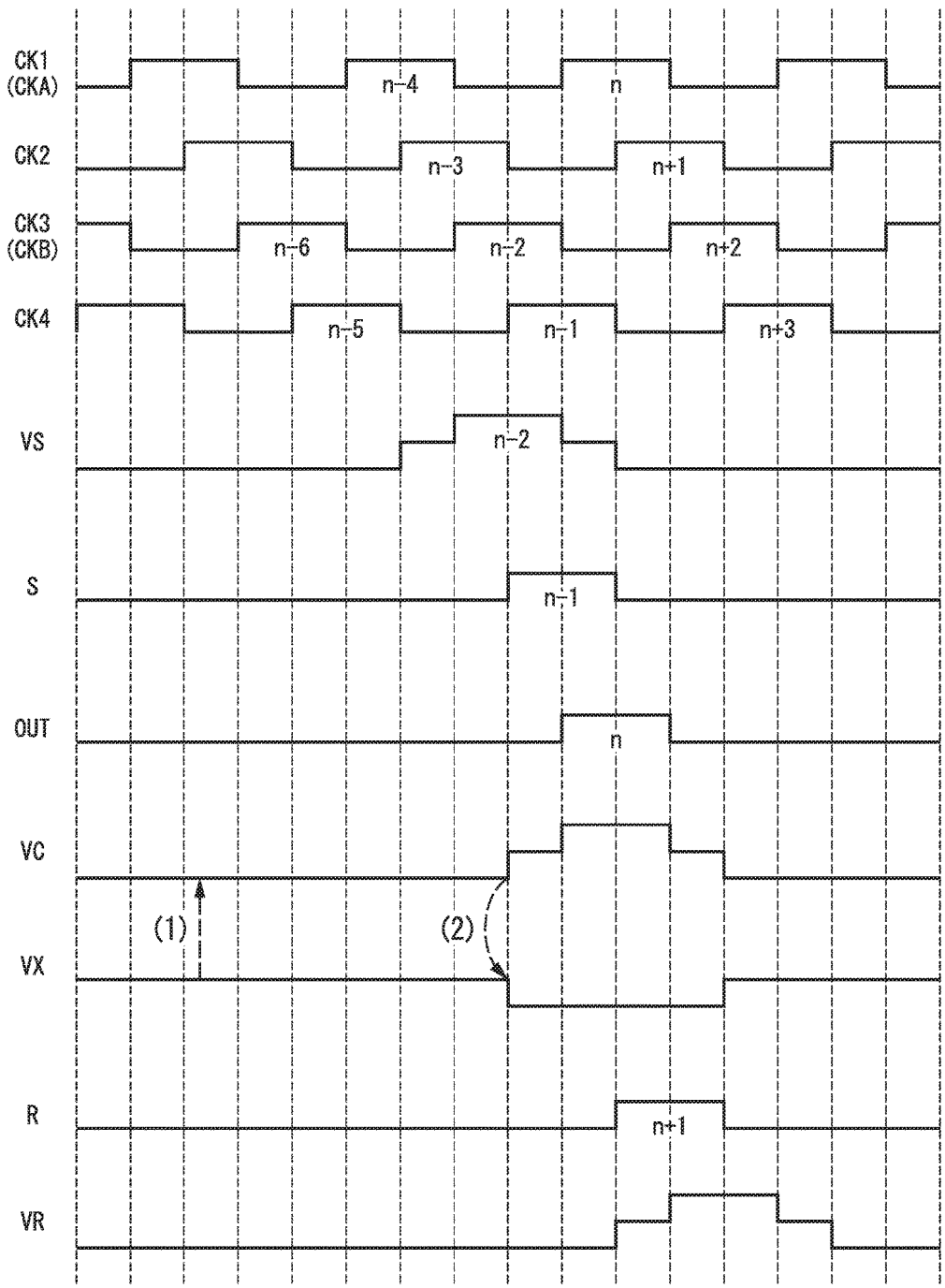
FIG. 11 is a timing chart of an operation of the unit shift register circuit 122b shown in FIG. 10 (the third embodiment).

Next, a third embodiment of the present invention will be described with reference to FIGS. 10 and 11. FIG. 10 is a block diagram showing a configuration example of a unit shift register circuit 122b (a third embodiment) according to the present invention. In addition, FIG. 11 is a timing chart of an operation of the unit shift register circuit 122b shown in FIG. 10 (the third embodiment). As shown in FIG. 10, the unit shift register circuit 122b of the third embodiment is different from the unit shift register circuit 122 of the first embodiment shown in FIG. 3 in that the former has a configuration of a circuit for pulling down a node VC (a DC pull-down circuit). A configuration of a shift register circuit and a configuration of a liquid crystal display device in which a plurality of unit shift register circuits 122b are used are similar to those of the first embodiment.

As shown in FIG. 10, the unit shift register circuit 122b of the third embodiment has a DC pull-down circuit constituted by a T5, a T6 and a T7. The T6 has a drain and a gate connected to a VDD power source, and a source connected to a drain of the T7 and a gate of the T5 (i.e., a node VX). The T7 has a source connected to a VSS power source and a gate connected to the node VC. The T5 has a drain connected to the node VC and a source connected to another VSS power source. In other words, the DC pull-down circuit of the present embodiment has an inverter circuit (the T6 and T7) having a first gate terminal as an input and a transistor (the T5) of which the gate receives input of the output of the inverter circuit and a drain terminal is connected to the first gate terminal, and pulls down the first gate terminal in accordance with a voltage of the first gate terminal.

As shown in FIG. 10, the T6 and the T7 constitute a circuit that generates VX signals (signals of a node VX), and when the T1 (output OUT) is not selected, the node VX is precharged to the voltage obtained by lowering a potential of the VDD power source by a threshold voltage of the T6 via the T6, and the node VC is pulled down to the VSS level by the T5 connected to the node VX at all times (at the timing indicated by (1) in FIG. 11). When the node VC is charged in a precharge operation at the time of selection, the T7 is turned on and the node VX is lowered close to the VSS level (the timing indicated by (2) of FIG. 11). A potential of the VX at that time is decided on the basis of a ratio of the T6 and the T7, and can be realized by increasing a capability of the T7 with respect to the T6.

In the third embodiment, pull-down is performed in accordance with a level of a direct current voltage DC of the node VX, and thus by eliminating a period in which the node VC floats at the time of non-selection, noise resistance can be enhanced. In other words, since floating of the node VC caused by coupling can be completely prevented with a pulse of a CKA, clock noise in which noise of the CKA is output to the GL can be suppressed.

In addition, in the present embodiment, since it is not necessary for a gate voltage of the T7 to have a large size in consideration of a drop of the voltage after degradation in order to avoid a drop of the precharge voltage level during a set operation caused by the threshold voltage, a size of a TFT can be small. A circuit area can be reduced accordingly.

Fourth Embodiment

Figure 12:
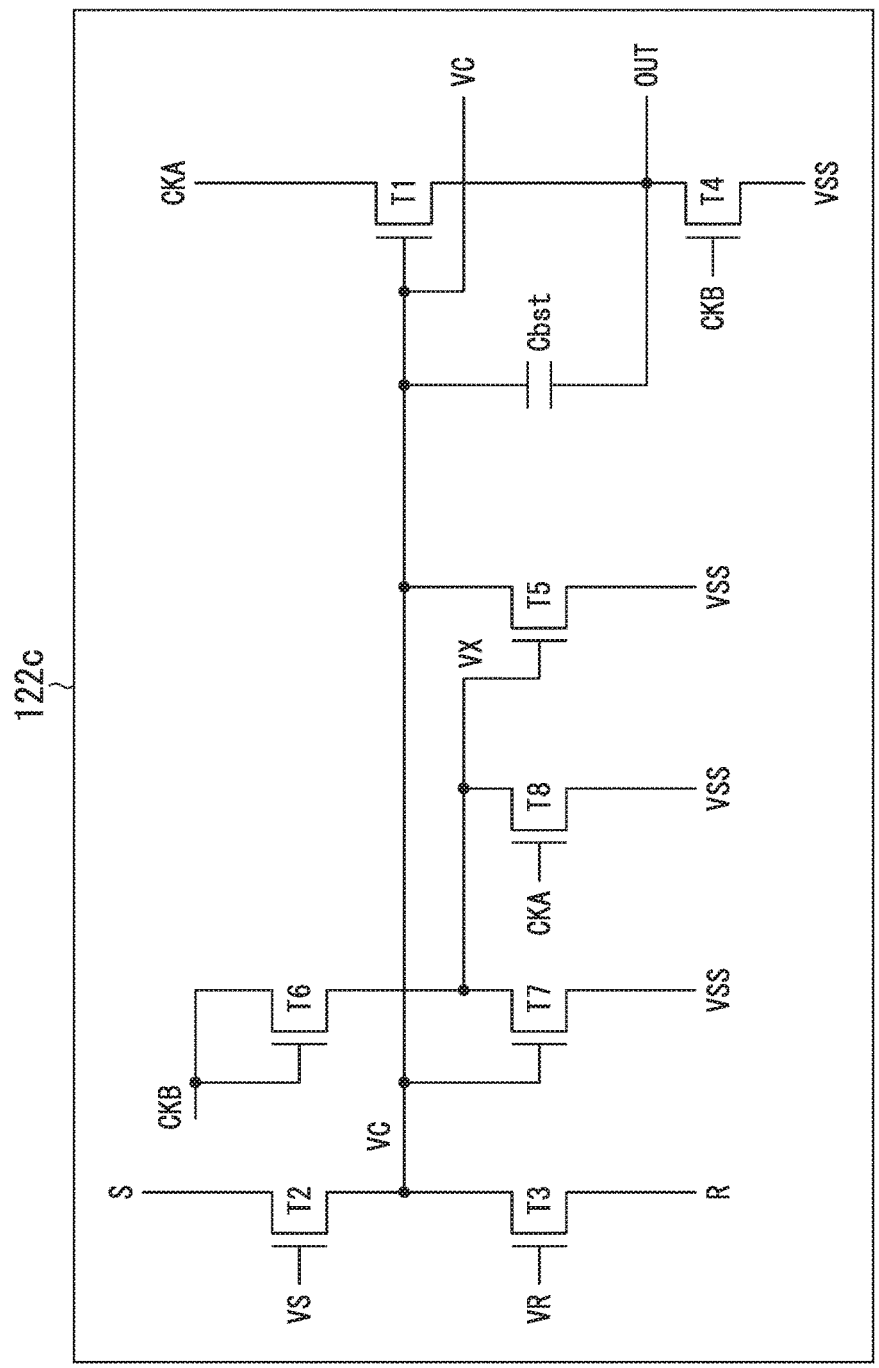
FIG. 12 is a block diagram showing a configuration example of a unit shift register circuit 122c (a fourth embodiment) according to the present invention.
Figure 13:
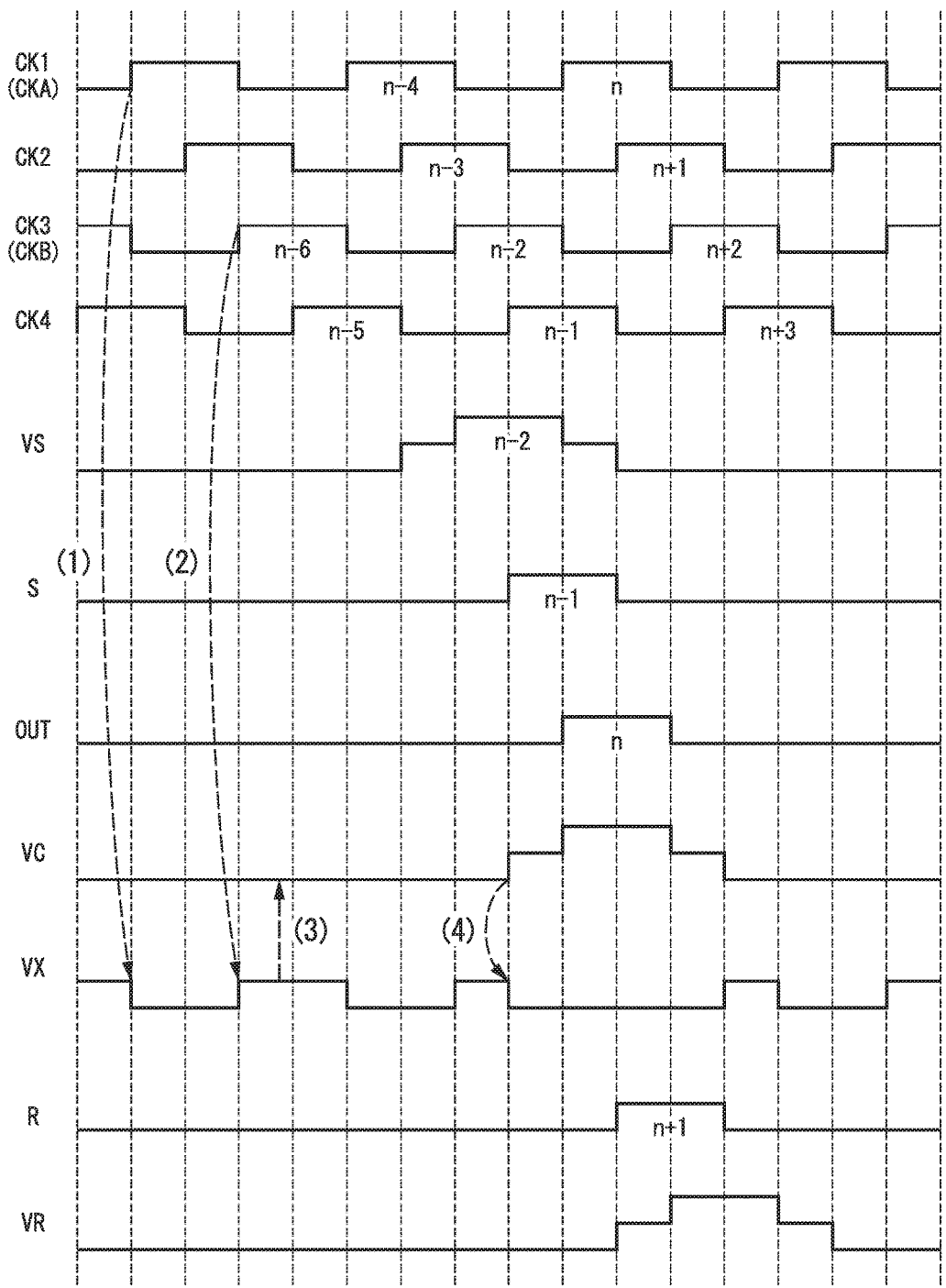
FIG. 13 is a timing chart of an operation of the unit shift register circuit 122c shown in FIG. 12 (the fourth embodiment).

Next, a fourth embodiment of the present invention will be described with reference to FIGS. 12 and 13. FIG. 12 is a block diagram showing a configuration example of a unit shift register circuit 122c (a fourth embodiment) according to the present invention. In addition, FIG. 13 is a timing chart of an operation of the unit shift register circuit 122c shown in FIG. 12 (the fourth embodiment). As shown in FIG. 12, the unit shift register circuit 122c of the fourth embodiment is different from the unit shift register circuit 122 of the first embodiment shown in FIG. 3 in that the former has a configuration of a circuit for pulling down a node VC (an AC pull-down circuit). A configuration of a shift register circuit and a configuration of a liquid crystal display device in which a plurality of unit shift register circuits 122c are used are similar to those of the first embodiment.

As shown in FIG. 12, the unit shift register circuit 122c of the fourth embodiment has an AC pull-down circuit constituted by a T5, a T6, a T7, and a T8. The T6 has a drain and a gate connected to a CKB, and a source connected to drains of the T7 and T8 and a gate of the T5 (i.e., a node VX). The T7 has a source connected to a VSS power source and a gate connected to a node VC. The T5 has a drain connected to the node VC and a source connected to a VSS power source. The T8 has a gate connected to a CKA and a source connected to a VSS power source. In other words, the AC pull-down circuit of the present embodiment has a push-pull circuit (the T6 and the T8) for a clock signal and a clock signal having the opposite phase thereto, a transistor (the T7) of which a gate terminal receives input of a first gate terminal that pulls down an output node of the push-pull circuit, and a transistor (the T5) of which a gate receives input of the output node of the push-pull circuit and drain terminal is connected to the first gate terminal, and pulls down the first gate terminal in accordance with a voltage of the first gate terminal.

As shown in FIG. 13, when the T1 (output OUT) is not selected, the T6 receives input of a CKB in diode connection, and when the CKB reaches an H level (here, the timing at which CK3 is at an H level indicated by (2) in FIG. 13), a VX is precharged. In addition, the T8 has the gate connected to the CKA and the source connected to the VSS, and when the CKA reaches an H level (here, the timing at which CK1 is at an H level indicated by (1) in FIG. 13), the VX is discharged to the level of the VSS. The T5 has the gate connected to the node VX, and pulls down (performs AC pull-down on) the node VC to the level of the VSS with 50% duty (the timing indicated by (3) in FIG. 13). When the node VC is charged in a precharge operation at the time of selection, the T7 is turned on, which lowers the node VX to a level close to the level of VSS (the timing indicated by (4) in FIG. 13). A potential of the VX at this time is decided on the basis of a ratio of the T6 and the T7, and can be realized by increasing a capability of the T7 with respect to the T6.

In the fourth embodiment, pull-down is performed in accordance with the level of the node VX, and thus the node VC can be pulled down with 50% duty at the time of non-selection, and noise resistance is enhanced. In addition, since gate stress of the T5 also becomes 50% duty at this time, gate stress of the T5 can be reduced more than when pull-down is performed with 100% duty.

In addition, in the present embodiment, since it is not necessary for a gate voltage of the T7 to have a large size in consideration of a drop of the voltage after degradation in order to avoid a drop of the precharge voltage level during a set operation caused by the threshold voltage, a size of a TFT can be small. A circuit area can be reduced accordingly.

Fifth Embodiment

Figure 14:
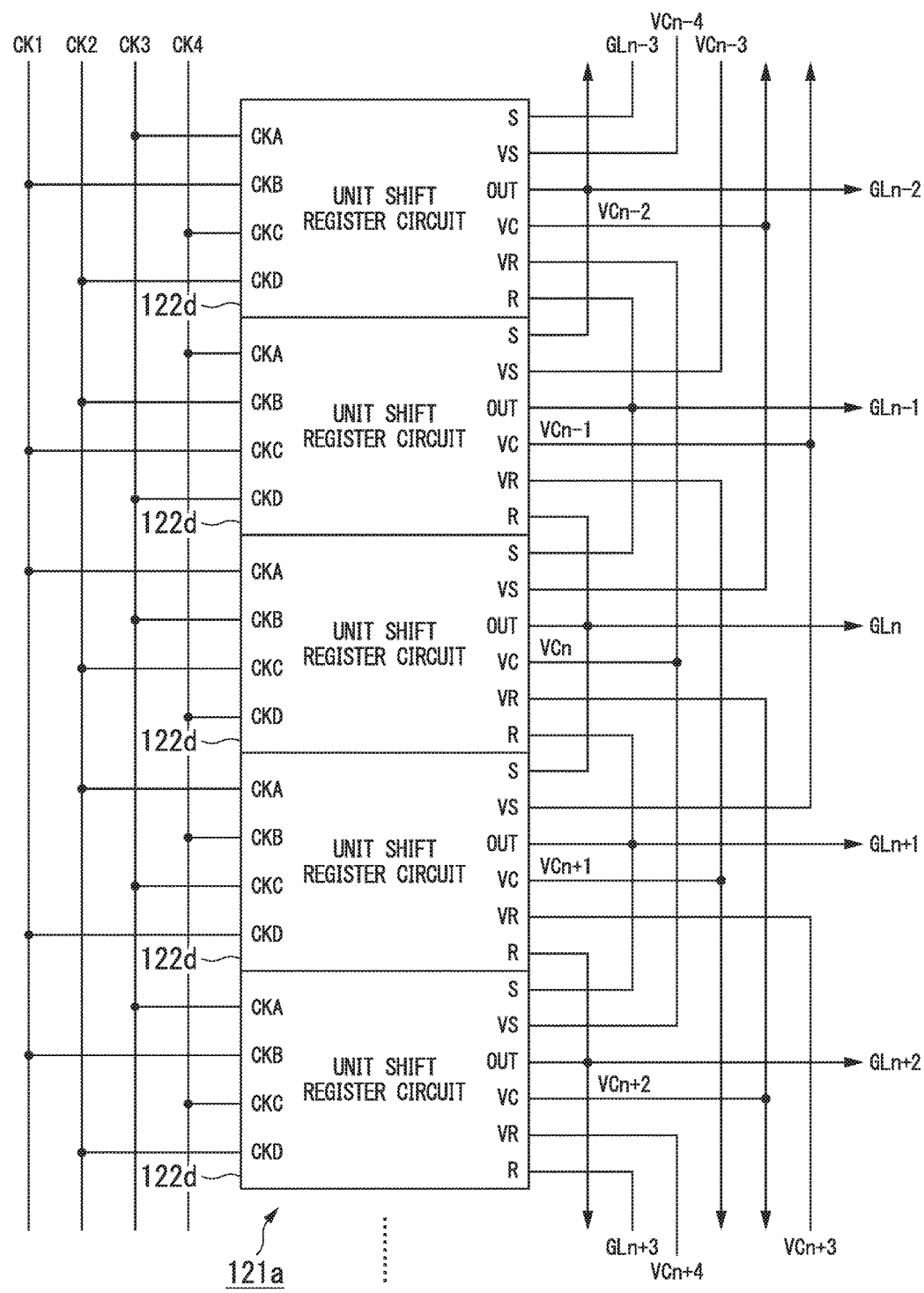
FIG. 14 is a block diagram showing a configuration example of a shift register circuit (a fifth embodiment) according to the present invention.

Next, a fifth embodiment of the present invention will be described with reference to FIGS. 14 and 15. FIG. 14 is a block diagram showing a configuration example of a shift register circuit (the fifth embodiment) according to the present invention. Although FIG. 14 shows 5 unit shift register circuits 122d and their input and output signal lines, this number is an example.

In the configuration example shown in FIG. 14, the shift register circuit 121a is configured in a plurality of stages (stages) that are in cascade connection. A unit shift register circuit 122d constituting each stage has a clock terminal CKA, a clock terminal CKB, a clock terminal CKC, a clock terminal CKD, a terminal S, a terminal VS connected to a gate terminal of a transistor T2, an output terminal OUT, a terminal VC connected to a node VC, a terminal VR connected to a gate terminal of a transistor T3, and a terminal R.

With respect to the unit shift register circuit 122d of an N-th stage, an output GLn−1 of its preceding stage is input as a signal S that is an input signal of the terminal S of the N-th stage, an output VCn−2 of the stage before the preceding stage is input as a signal VS that is an input signal of the terminal VS of the N-th stage, an output GLn+1 of the subsequent stage is input as a signal R that is an input signal of the terminal R of the N-th stage, and an output VCn+2 of the stage after the subsequent stage is input as a signal VR that is an input signal of the terminal VR of the N-th stage.

A clock signal CKA input to the clock terminal CKA, a clock signal CKB input to the clock terminal CKB, a clock signal CKC input to the clock terminal CKC, and a clock signal CKD input to the clock terminal CKD are 4-phase clock signals, and are connected to the unit shift register circuits 122d as follows. In other words, the signals are connected at each of the 4 stages of the unit shift register circuits 122d in order like this: CKA=CK1, CKB=CK3, CKC=CK2 and CKD=CK4; CKA=CK2, CKB=CK4, CKC=CK3 and CKD=CK1; CKA=CK3, CKB=CK1, CKC=CK4 and CKD=CK2; CKA=CK4, CKB=CK2, CKC=CK1 and CKD=CK3; CKA=CK1, CKB=CK3, CKC=CK2 and CKD=CK4; CKA=CK2, CKB=CK4, CKC=CK3 and CKD=CK1; and so on. Here, the clock signal CKA and the clock signal CKB are opposite phased clock signals to each other. In addition, in a FWD operation, the operation progresses in order of a clock signal CKA, a clock signal CKD, a clock signal CKB, and a clock signal CKC with their cycles deviating backward by ¼ of a cycle from each other, and in a BWD operation, the operation progresses in order of a clock signal CKA, a clock signal CKD, a clock signal CKB, and a clock signal CKC with their cycles deviating forward by ¼ of a cycle from each other.

Figure 15:
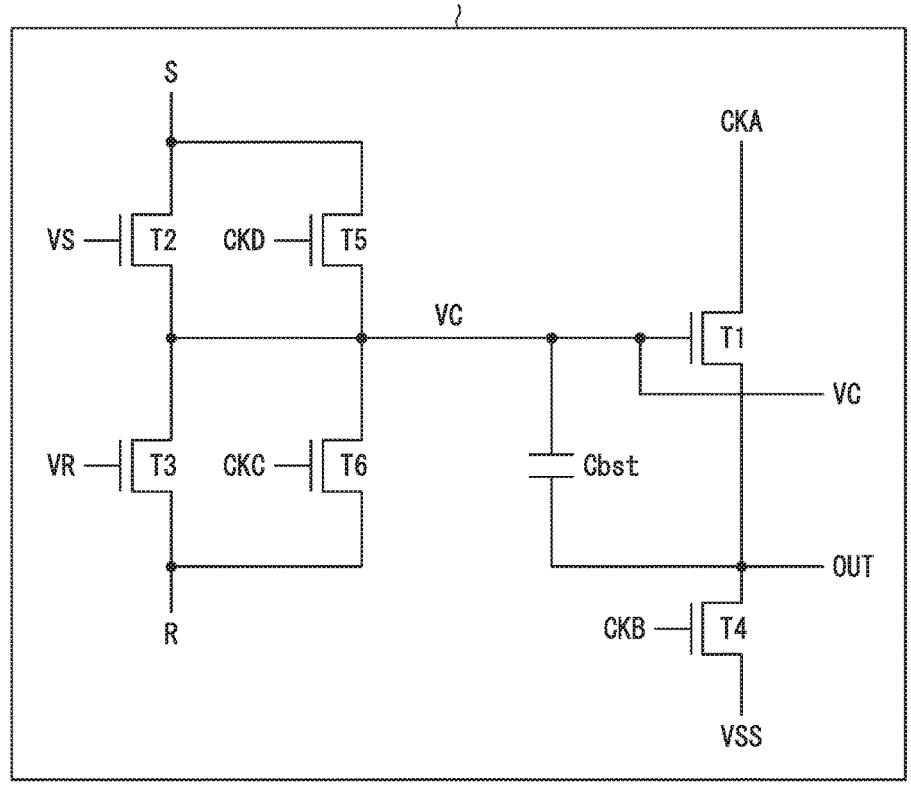
FIG. 15 is a block diagram showing a configuration example of a unit shift register circuit 122d shown FIG. 14 (the fifth embodiment).

FIG. 15 is a block diagram showing a configuration example of a unit shift register circuit 122*d* shown FIG. 14 (the fifth embodiment).

As shown in FIG. 15, the unit shift register circuit 122*d* is constituted by a T1 and a T4 connected to a GL (OUT) that drives each scanning line, and transistors T2, T3, T5, and T6 that are connected to a node VC that leads to a gate terminal of the T1. A gate terminal of the T2 is connected to a signal VS and a drain terminal thereof is connected to a signal S. In addition, a gate terminal of the T3 is connected to a signal VR, and a drain terminal thereof is connected to a signal R. Furthermore, a gate terminal of the T5 is connected to a clock signal CKD, and a drain terminal thereof is connected to the signal S. In addition, a gate terminal of the T6 is connected to a clock signal CKC, and a drain terminal thereof is connected to the signal R.

The T1 is an output transistor for outputting a pulse signal to the output terminal OUT. The T1 has a drain connected to the clock terminal CKA, a gate connected to the node VC, and a source connected to the output terminal OUT.

The T2 has the gate connected to the terminal Vs, the drain connected to the terminal S, and a source connected to the node VC.

The T3 has the gate connected to the terminal VR, the drain connected to the terminal R, and a source connected to the node VC.

The T4 has a gate connected to a clock terminal CKB, a drain connected to the output terminal OUT, and a source connected to a terminal VSS. The power source voltage VSS serves as a reference voltage in operations of the unit shift register circuit 122*d*.

The T5 is a transistor for connecting the node VC to the terminal S in a period in which an H level is input to the terminal CKD. The T5 has the gate connected to the clock terminal CKD, the drain connected to the terminal S, and a source connected to the node VC.

The T6 is a transistor for connecting the node VC to the terminal R in a period in which an H level is input to the terminal CKC. The T6 has the gate connected to the clock terminal CKC, the drain connected to the terminal R, and a source connected to the node VC.

Note that, for example, a relationship between the configuration shown in FIG. 15 and the configuration of the present invention described in the claims is as follows. The transistor T5 is a transistor which is connected to the transistor T2 (the second transistor) in parallel and has the gate that receives input of a clock signal CKD of which a cycle deviates backward by ¼ of a cycle from a clock signal CKA in a forward shift operation and deviates forward by ¼ of a cycle from a clock signal CKA in a backward shift operation. The transistor T6 is a transistor which is connected to the transistor T3 (the third transistor) in parallel and has the gate that receives input of a clock signal CKC of which a cycle deviates forward by ¼ of a cycle from a clock signal CKA in a forward shift operation and deviates backward by ¼ of a cycle from a clock signal CKA in a backward shift operation.

Figure 16:
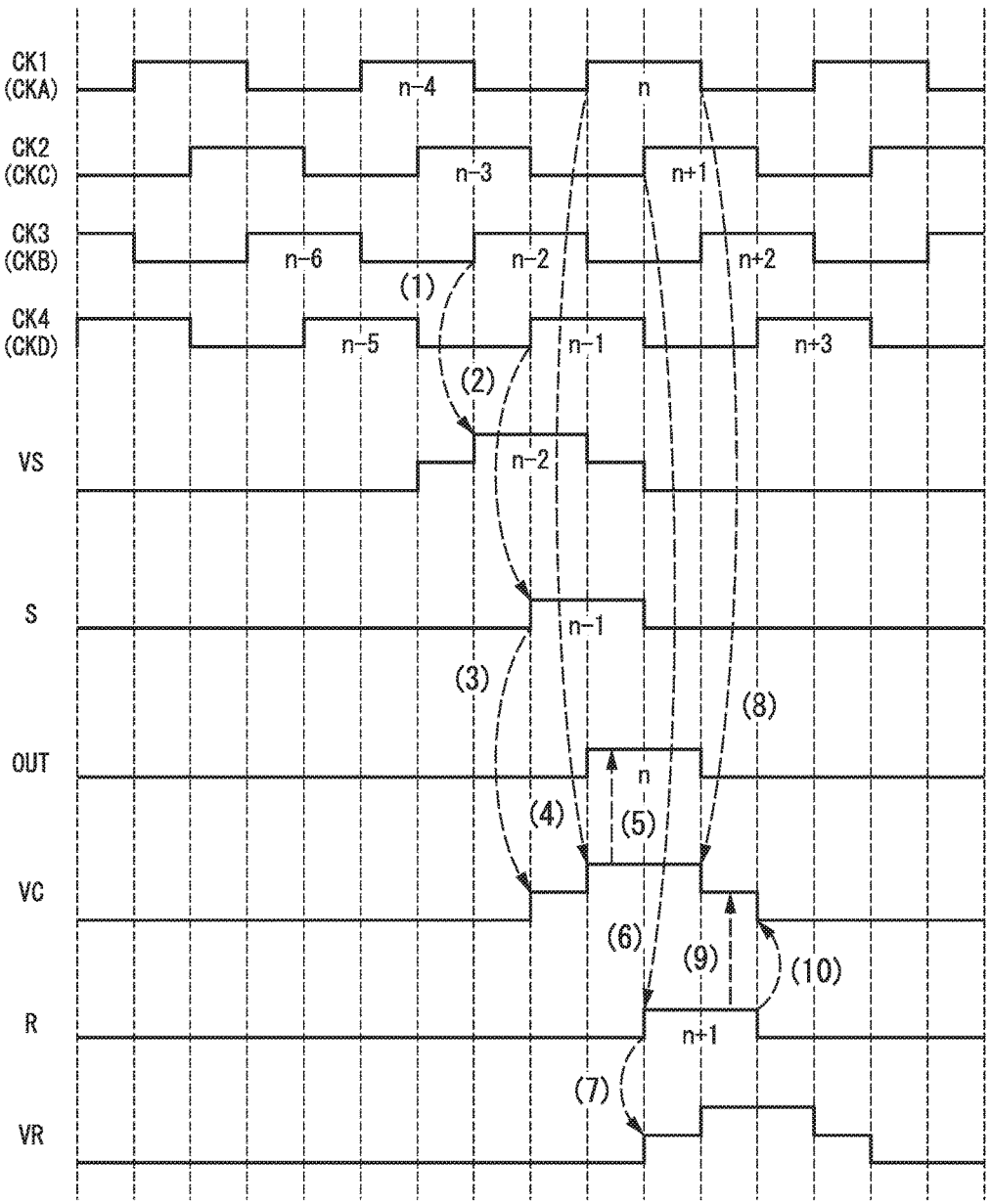
FIG. 16 is a timing chart of a FWD direction operation of the unit shift register circuit 122d shown in FIG. 15 (the fifth embodiment).

Next, an operation example of the unit shift register circuit 122*d* shown in FIG. 15 will be described with reference to FIGS. 16 and 17. FIG. 16 is a timing chart of a FWD direction operation of the unit shift register circuit 122*d* shown in FIG. 15 (the fifth embodiment). Driving of the unit shift register circuit 122*d* in the N (=n)-th stage is performed as follows.

The unit shift register circuit 122*d* of the stage before the preceding stage operates and a boosted (voltage of) node VCn−2 is input to the terminal VS at the timing indicated by (1) and its relevant dotted arrow in FIG. 16.

Next, the unit shift register circuit 122*d* of the preceding stage operates and an output GLn−1 is input to the terminal S at the timing indicated by (2) in FIG. 16.

Here, VS is a boosted voltage, and the node VC is charged by an input signal from S as it is at the timing indicated by (3) in FIG. 16.

Next, when a pulse of CK1 is given in a state in which the gate terminal of the T1 is charged, the node VC is boosted through a bootstrap operation and has a high potential at the timing indicated by (4) in FIG. 16. At this time, the T5 has a CKD of an H level (CKD=H) and the terminal S is at an H level (S=H), and thus no leakage from the node VC occurs.

Here, since the node VC is boosted to have a sufficiently high voltage at the timing indicated by (5) in FIG. 16, a pulse of a CK is output to the output terminal OUT, i.e., GLn.

At the same time, an output OUT is input to the terminal S in the subsequent stage at the timing indicated by (6) in FIG. 16, and an output of the subsequent stage is output to GLn+1 due to a rise of CK2.

Further, the node VC of the stage after the subsequent stage is precharged due to GLn+1 at the timing indicated by (7) in FIG. 16. At this time, the T6 has a CKC of an H level (CKC=H) and the terminal R is at an H level (R=H), and thus no leakage from the node VC occurs.

The output OUT is pulled down due to a fall of the pulse of CK1 and the voltage of the node VC decreases to the value before the boosting at the timing indicated by (8) in FIG. 16.

When the VR is boosted at the timing indicated by (9) in FIG. 16, the node VC is fixed to the output from R.

When the node R is pulled down at the timing indicated by (10) in FIG. 16, the node VC is also pulled down.

Figure 17:
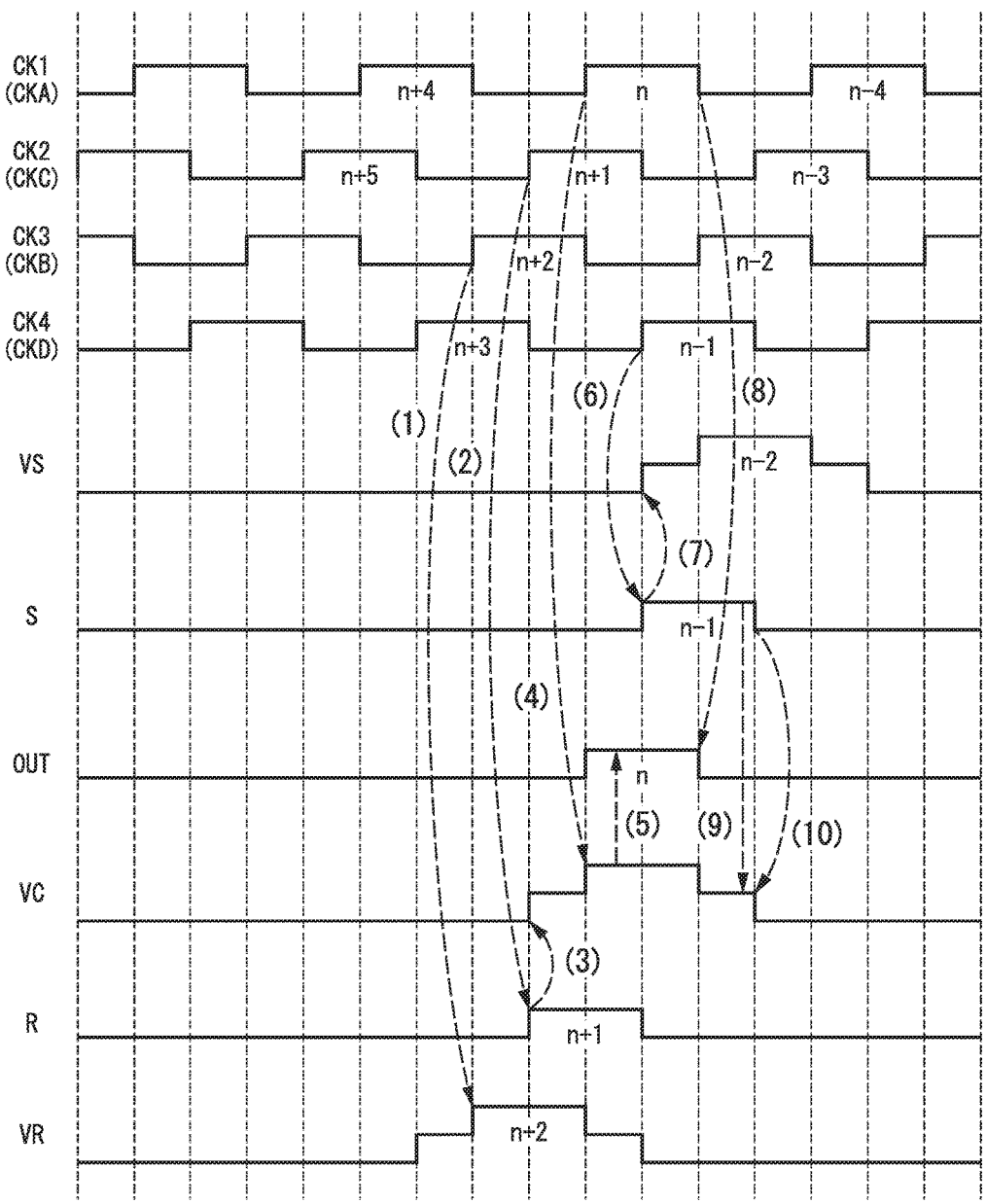
FIG. 17 is a timing chart of a BWD direction operation of the unit shift register circuit 122d shown in FIG. 15 (the fifth embodiment).

FIG. 17 is a timing chart of a BWD direction operation of the unit shift register circuit 122*d* shown in FIG. 15 (the fifth embodiment). Driving of the unit shift register circuit 122*d* in the N (=n)-th stage is performed as follows.

The unit shift register circuit 122*d* of the stage after the subsequent stage operates and a boosted (voltage of) node VCn+2 is input to the terminal VR at the timing indicated by (1) and its relevant dotted arrow in FIG. 17.

Next, the unit shift register circuit 122*d* of the subsequent stage operates and an output GLn+1 is input to the terminal R at the timing indicated by (2) in FIG. 17.

Here, the VR is a boosted voltage and an input signal from R charges the node VC as it is at the timing indicated by (3) in FIG. 17.

Next, when a pulse of CK1 is given in a state in which the gate terminal of the T1 is charged, the node VC is boosted through a bootstrap operation and has a high potential at the timing indicated by (4) in FIG. 17. At this time, the T6 has CKC=H and R=H, and no leakage from the node VC occurs.

Here, since the node VC is boosted to a sufficiently high voltage at the timing indicated by (5) in FIG. 17, the pulse of the CK is output to the output terminal OUT, i.e., GLn.

At the same time, an output OUT is input to the terminal S in the preceding stage at the timing indicated by (6) in FIG. 17, and an output of the preceding stage is output to GLn−1 due to a rise of CK4.

Further, the node VC of the stage before the preceding stage is precharged by GLn−1 at the timing indicated by (7) in FIG. 17. At this time, the T5 has CKD=H and S=H, and thus no leakage from the node VC occurs.

The output OUT is pulled down due to a fall of the pulse of CK1 and the voltage of the node VC decreases to the value before the boosting at the timing indicated by (8) in FIG. 17.

When VS is boosted at the timing indicated by (9) in FIG. 17, the node VC is fixed to an output from S.

When the terminal S is pulled down at the timing indicated by (10) in FIG. 17, the node VC is also pulled down.

Figure 18:
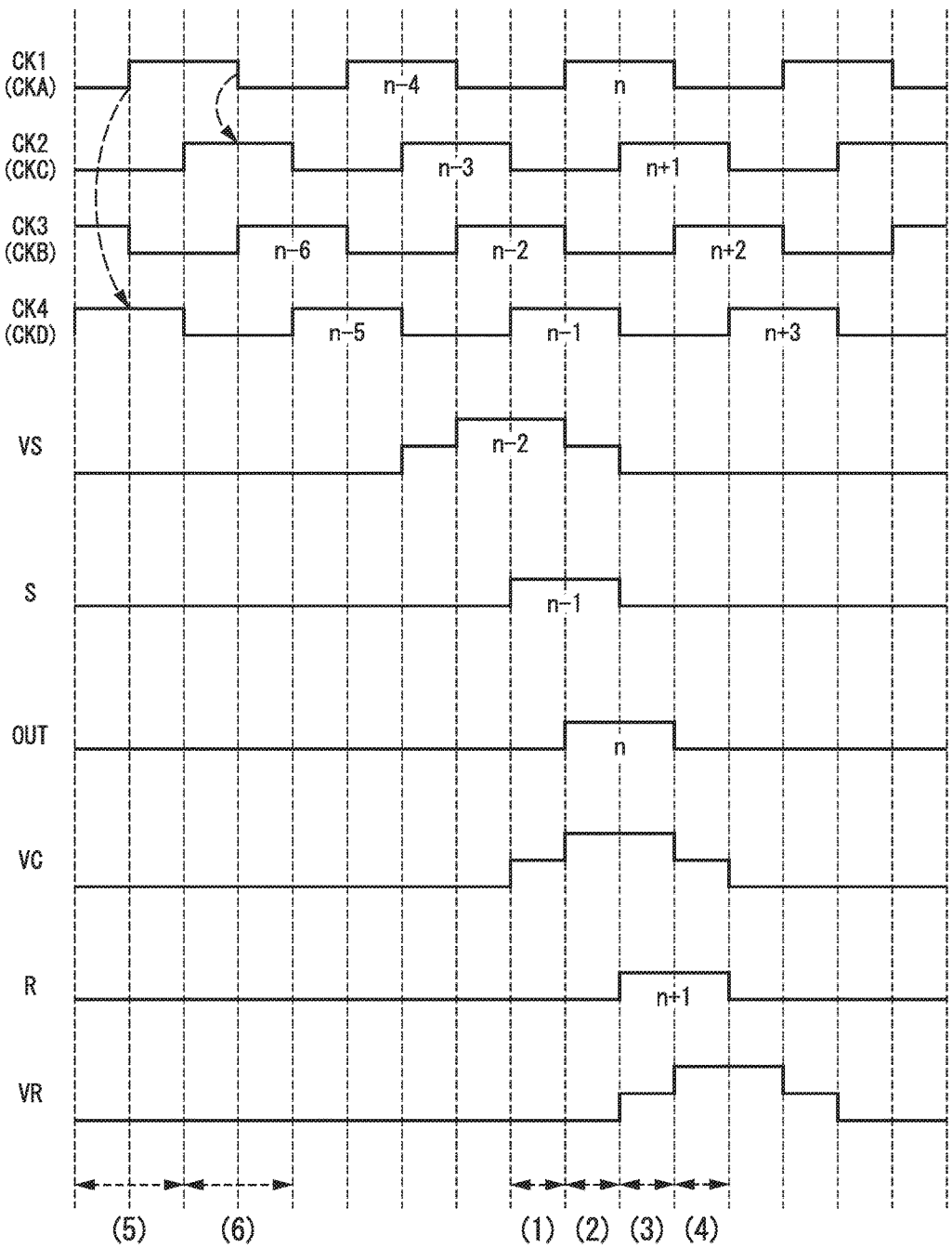
FIG. 18 is a timing chart of a FWD direction operation for describing an effect of the unit shift register circuit 122d (the fifth embodiment) according to the present invention.

Next, effects of the fifth embodiment will be described with reference to FIGS. 18 to 24. FIG. 18 is a timing chart of a FWD direction operation for describing an effect of the unit shift register circuit 122d (the fifth embodiment) according to the present invention. Note that FIG. 18 shows periods (1) to (6), instead of timings (1) to (10) of the timing chart of the FWD direction operation shown in FIG. 16. The effects of the unit shift register circuit 122d in the periods will be described FIGS. 19 to 23. FIG. 19 to FIG. 23 are diagrams showing the unit shift register circuit 122d of the N-th stage, a part of the unit shift register circuit 122d of the preceding stage, and a part of the unit shift register circuit 122d of the subsequent stage. FIGS. 19 to 23 are diagrams for describing voltage application states and voltage input and output routes in the voltage application states of the unit shift register circuit 122d of the N-th stage and the unit shift register circuits 122d of the stages before and after the N-th stage in the periods (1) to (6). Note that, in FIGS. 19 to 23, transistors that are turned off are indicated by X marks.

Figure 19:
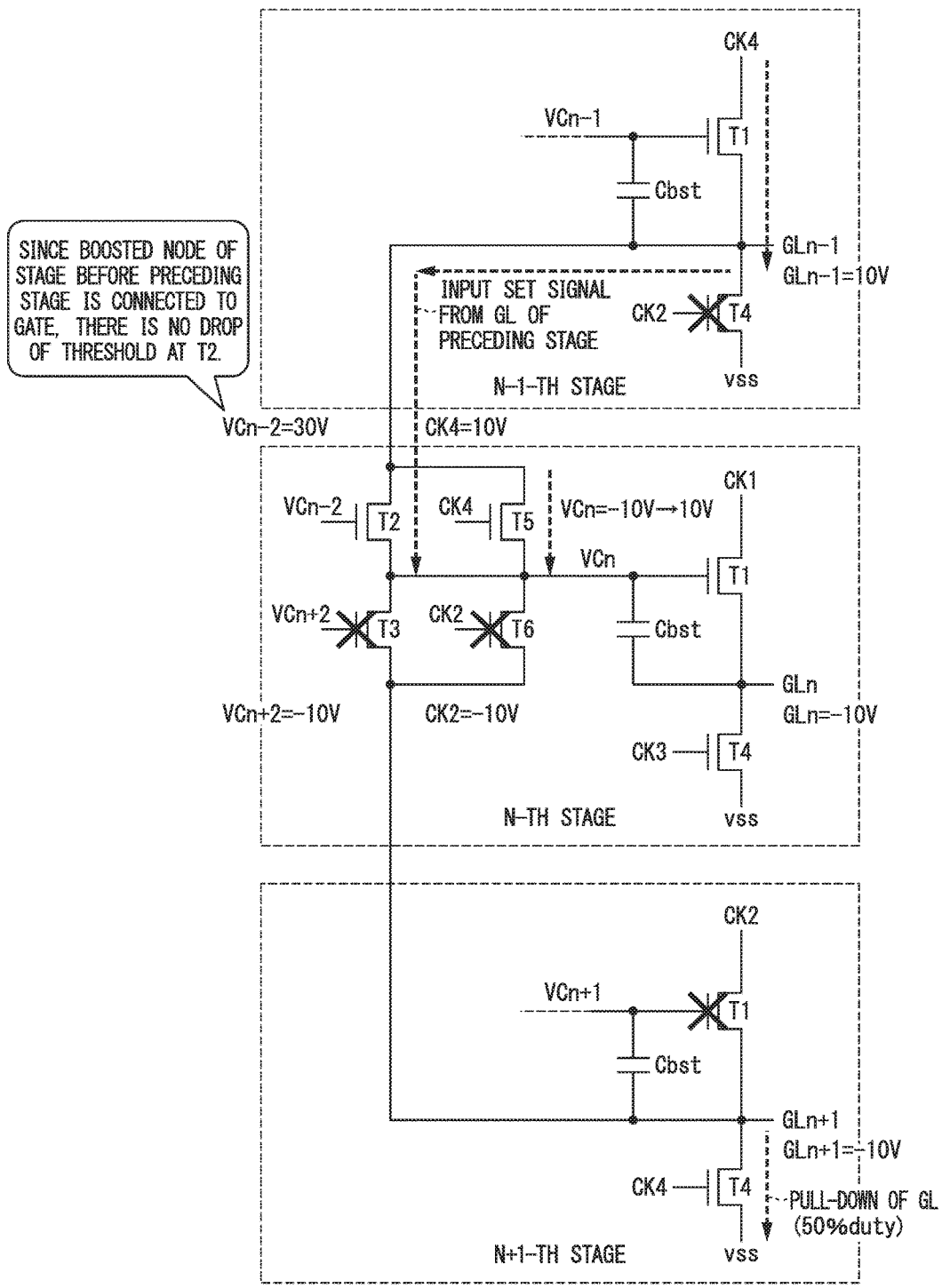
FIG. 19 is a diagram showing the voltage application state and an input/output route in the period (1) of the timing chart of the operation shown in FIG. 18.

FIG. 19 is a diagram showing the voltage application state and the input/output route in the period (1) of the timing chart of the operation shown in FIG. 18. FIG. 19 shows a voltage application state and an input and output route in a set operation when the T1 (output OUT) is selected. In the period (1) of the timing chart of the operation shown in FIG. 18, an output from GLn−1 of the preceding stage is set to VCn via the T2 of the N-th stage. At this time, since a potential of the node VC of the preceding-by-2-stages stage is input to the gate of the T2, a voltage thereof has a boosted value (e.g., 30 V), and a potential of VCn is charged to the same potential as GLn−1 (e.g., 10 V). Thus, even if a threshold voltage of the T2 positively shifts due to stress, the set voltage (10 V) does not decrease.

At this time, the T5 contributes to charging when the potential of VCn is low, but is in an off-state when the potential of VCn becomes higher than 14 V-Vth (a threshold value of the T5). It is turned off in a state of Vgs=0 V due to the potential of the gate and the source being the same.

Figure 20:
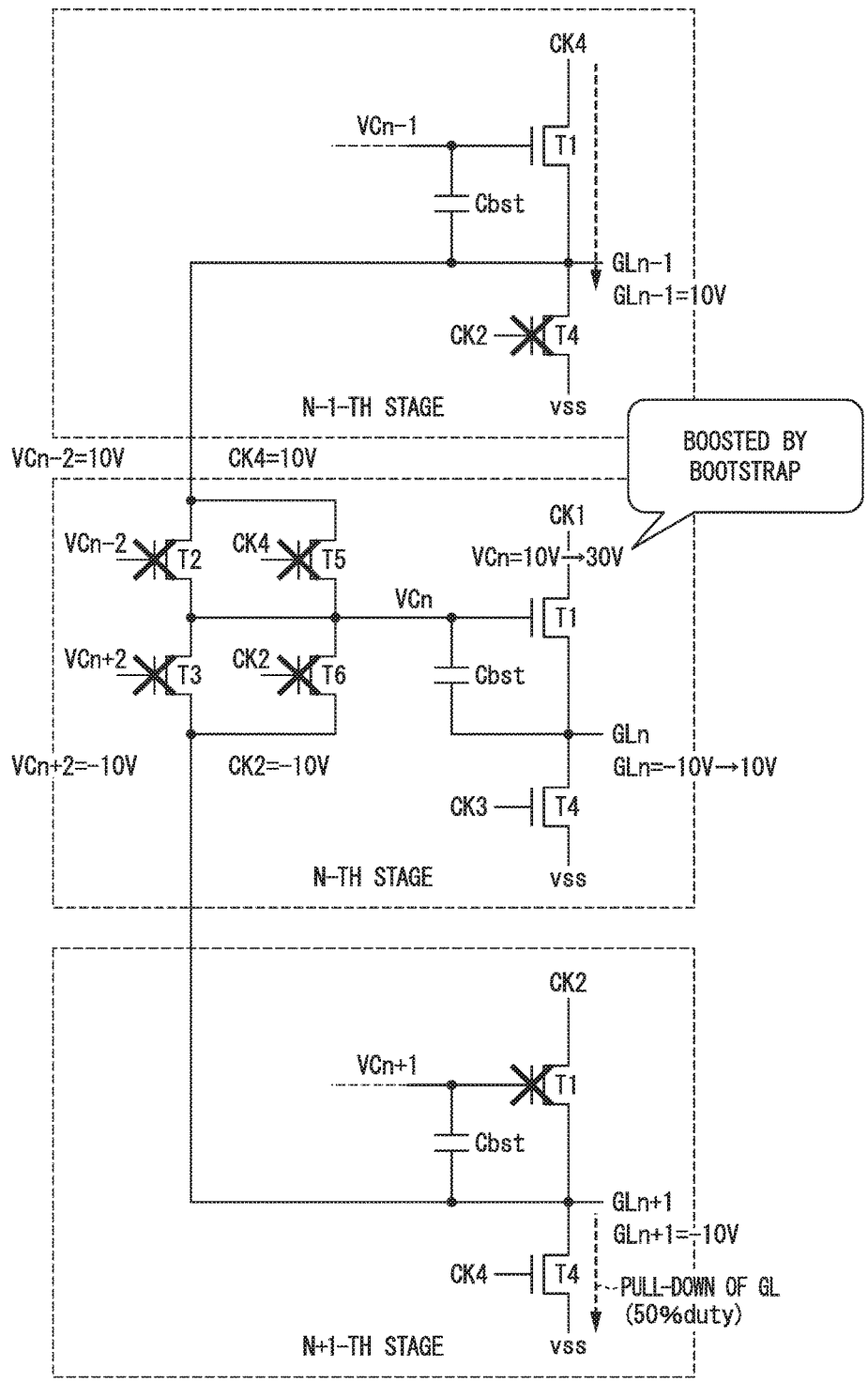
FIG. 20 is a diagram showing the voltage application state and an input/output route in the period (2) of the timing chart of the operation shown in FIG. 18.

FIG. 20 is a diagram showing the voltage application state and the input/output route in the period (2) of the timing chart of the operation shown in FIG. 18. FIG. 20 shows the voltage application state and the input and output route of a boost operation when the T1 (output OUT) is selected. When CK1 of the selected stage (N-th stage) rises from low (L) to high (H) in a state in which VCn is set (to 10 V here), the node VCn is pushed up to a high voltage (30 V here) due to a bootstrap operation, and thus GLn rises (to 10 V here). At this time, VCn is boosted to have a high potential, but the gates of the T2 and the T5 are at 10 V and the sources thereof have 10 V (which is equal to GLn−1 of the preceding stage), and thus no leakage to GLn−1 from VCn via the T2 and the T5 occurs. In addition, the gates of the T3 and the T6 are at −10 V and the sources thereof are at −10 V (which is equal to GLn+1 of the subsequent stage), and thus no leakage from VCn via the T3 and the T6 occurs. Thus, the potential of VCn at the time of the bootstrap operation can maintain a high boosted voltage, and accordingly, a driving force of the T1 can increase.

Figure 21:
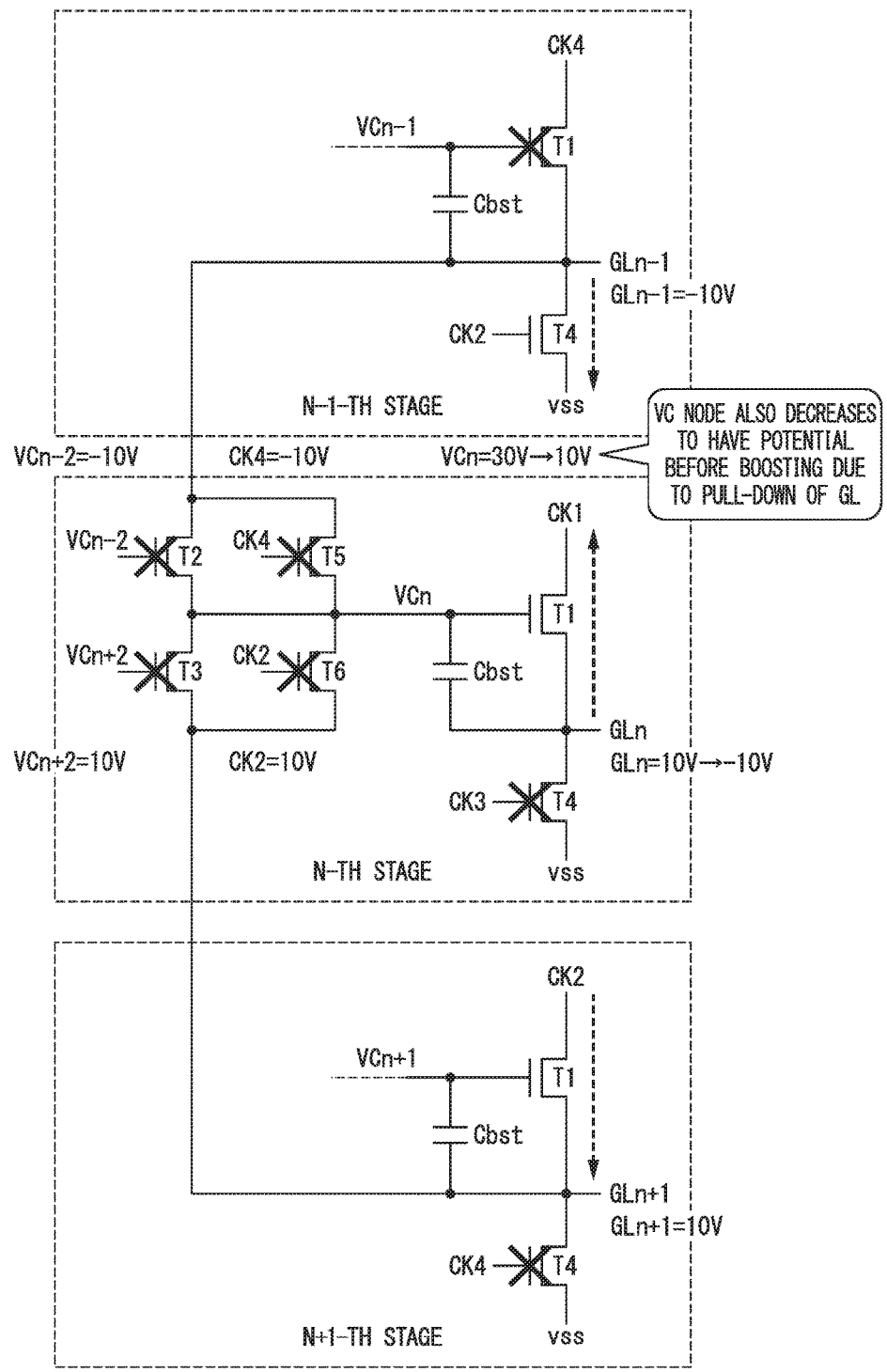
FIG. 21 is a diagram showing the voltage application state and an input/output route in the period (3) of the timing chart of the operation shown in FIG. 18.

FIG. 21 is a diagram showing the voltage application state and the input/output route in the period (3) of the timing chart of the operation shown in FIG. 18. FIG. 21 shows the voltage application state and the input and output route of a GL pull-down operation when the T1 (output OUT) is selected. When CK1 decreases from 10 V to −10 V, GLn is also pulled down from 10 V to −10 V. At the same time, the potential of VCn that was boosted to 30 V by the bootstrap decreases from 30 V to 10 V.

At this time, VCn is in a floating state, the gates of the T2 and the T5 are at −0 V and the sources thereof are at −10 V (which is equal to GLn−1 of the preceding stage), and thus no leakage from VCn to GLn−1 via the T2 and the T5 occurs. In addition, the gates of the T3 and the T6 are at 10 V and the sources thereof are at 10 V (which is equal to GLn+1 of the subsequent stage), and thus no leakage from VCn via the T3 and the T6 occurs. Thus, since VCn can maintain 10 V or higher at all times, a fall from 10 V to −10 V of GLn is reliably performed.

Figure 22:
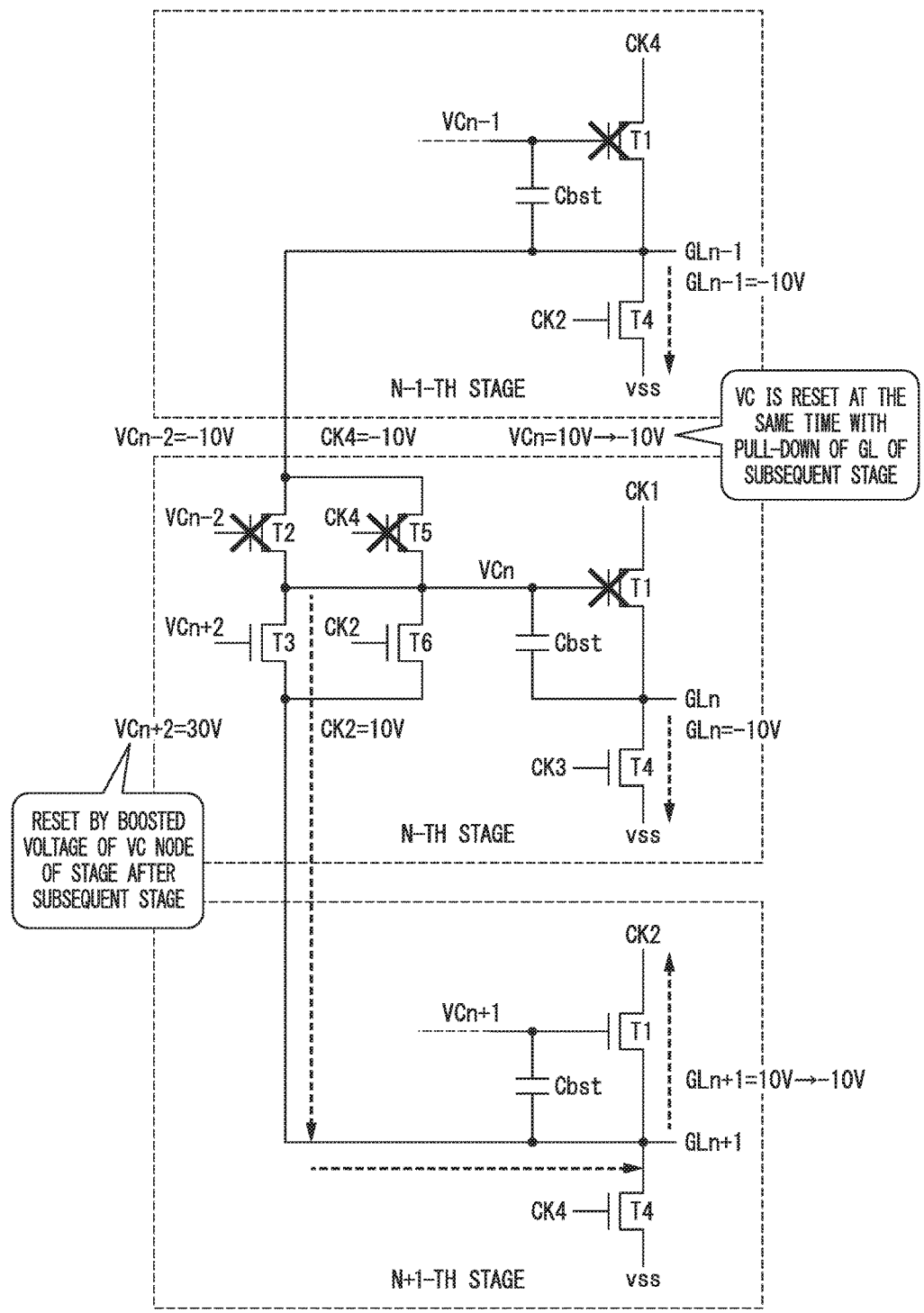
FIG. 22 is a diagram showing the voltage application state and an input/output route in the period (4) of the timing chart of the operation shown in FIG. 18.

FIG. 22 is a diagram showing the voltage application state and the input/output route in the period (4) of the timing chart of the operation shown in FIG. 18. FIG. 22 shows the voltage application state and the input and output route in a reset operation of the node VC when the T1 (output OUT) is selected. When GLn+1 of the subsequent stage is reset and decreases from 10 V to −10 V from a state in which an output (10 V here) from GLn+1 of the subsequent stage is set for VCn via the T3 of the N-th stage, VCn of the N-th stage is also pulled down to −10 V via the T3 and the T6. At this time, a boosted potential of the node VC of the stage after the subsequent stage is input to the gate of the T3, thus the T3 is pulled down with a great driving force, and further GLn+1 of the subsequent stage is also pulled down via the T1 having the great driving force. Thus, even if a threshold voltage of the T3 is positively shifted due to stress, a reset of the node VCn is performed with a sufficient margin.

Figure 23:
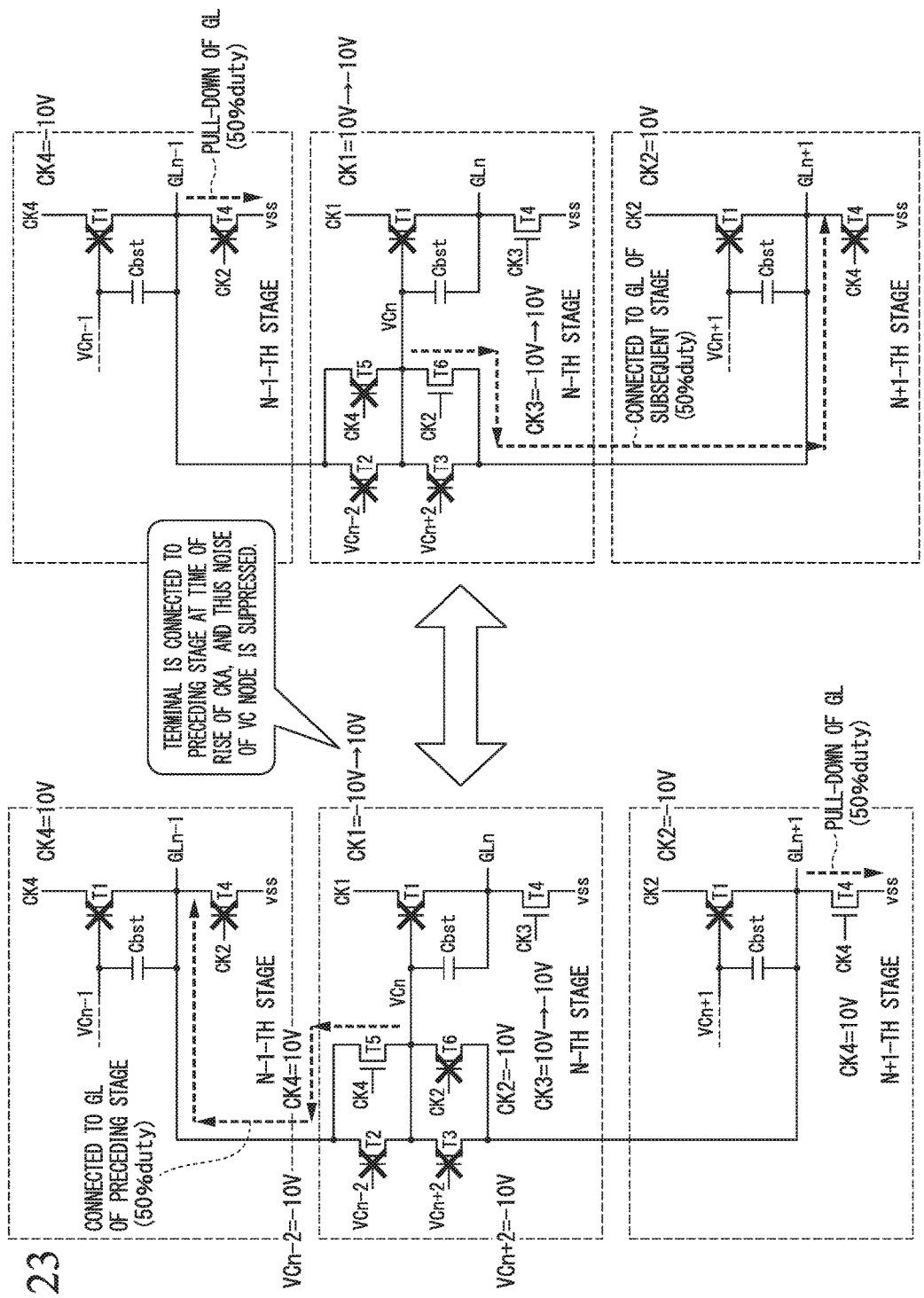
FIG. 23 is a diagram showing the voltage application states and input/output routes in the periods (5) and (6) of the timing chart of the operation shown in FIG. 18.

FIG. 23 is a diagram showing the voltage application states and input/output routes in the periods (5) and (6) of the timing chart of the operation shown in FIG. 18. FIG. 23 shows the voltage application states and the input and output routes of the node VC in the non-selection periods of the T1 (output OUT). In the non-selection period, GLn−1 of the preceding stage and the node VCn are connected via the T5 in a period in which CK4=H (a high level, which refers to 10 V here) and CK2=L (a low level, which refers to −10 V here) (the left state shown in FIG. 23 which is the period indicated by (5) of the timing chart shown in FIG. 18). In addition, GLn+1 of the subsequent stage and the node VCn are connected via the T6 in a period in which CK4=L (−10 V here) and CK2=H (10 V here) (the right state shown in FIG. 23 which is the period indicated by (6) of the timing chart shown in FIG. 18). Thus, since the node VCn is pulled down with 100% duty, noise resistance is enhanced.

A change in a voltage of CK1 has the greatest influence as noise of the node VCn, and the node VCn is connected to the preceding stage or the subsequent stage at any of the timings at which CK1 rises from L (low) to H and falls from H to L, and a capacitance of the GL as well as the node VCn contributes to a parasitic capacitance as a parasitic capacitance of VCn. In other words, if a coupling capacitance between CK1 and VCn is set to C1, a total capacitance of the node VCn is set to C2, and a capacitance of the GL is set to C3, a change in the voltage of the node VCn when CK1 changes is Vck×C1/(C1+C2+C3). Here, since the relationship of C1<<C3 is satisfied, the voltage of the node VCn is hardly changed by CK. In the present embodiment, this function is realized in both upward and downward directions (a FWD shift operation and a BWD shift operation).

Figure 24:
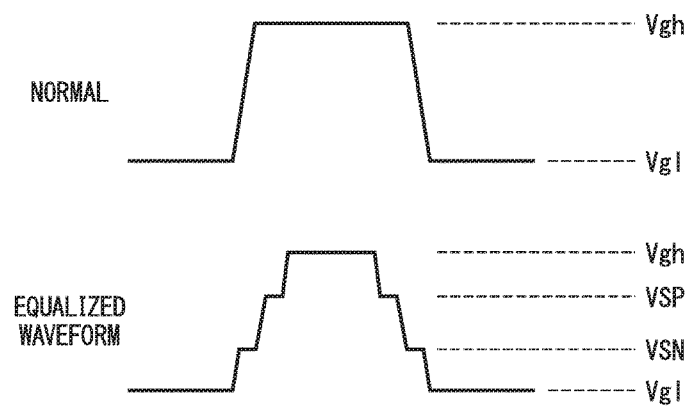
FIG. 24 is another diagram for describing an effect of the unit shift register circuit 122d (the fifth embodiment) according to the present invention.

With respect to a general IC driver, or the like when a high-frequency signal such as a clock is driven, an equalized signal can be output for the purpose of low power consumption. FIG. 24 is another diagram for describing an effect of the unit shift register circuit 122d (the fifth embodiment) according to the present invention. As shown in FIG. 24, while a normal waveform is a waveform in which an amplitude of CK transitions to an H potential (Vgh) and an L potential (Vgl), when, for example, there are power sources called VSP and VSN as internal power sources of an IC driver in a case of an equalized waveform (a voltage source having a lower absolute value than a CK power source), power consumption of driving can be suppressed by causing short-circuiting (or charge sharing) with the VSN and VSP power sources in the course of transitioning from Vgl to Vgh. However, in this case, transition times of rises and falls of the waveform of CK lengthen (the waveform becomes blunt).

When driving is performed in an equalized clock waveform as described above in the present embodiment, clocks are driven as 4-phase clocks, and the node VCn of the N-th stage is connected to GLs of the preceding stage and the subsequent stage using CK2 and CK4 whose phases deviate forward and backward by 90 degrees (¼ of a cycle) from CK1 at the time of a non-selection operation as described using FIG. 23. Thus, even when rise and fall transition times of the signal of CK1 lengthen due to equalization (even when an H period of CK becomes shorter with 50% duty or lower), the node VCn is able to be maintained stably at the time of the rise and the fall of CK1.

Sixth Embodiment

Figure 25:
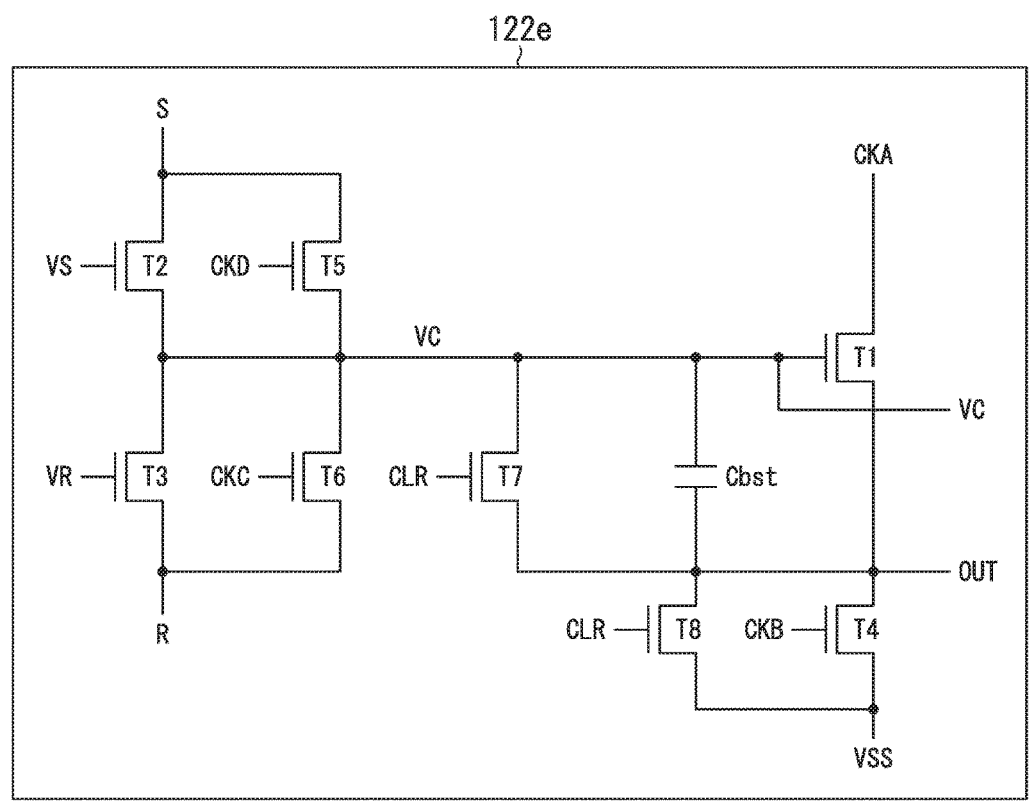
FIG. 25 is a block diagram showing a configuration example of a unit shift register circuit 122e (a sixth embodiment) according to the present invention.

Next, a sixth embodiment of the present invention will be described with reference to FIG. 25. As shown in FIG. 25, a unit shift register circuit 122e of the sixth embodiment has a circuit with a different configuration for pulling down an output terminal OUT and a node VC (a pull-down circuit) from the unit shift register circuit 122d of the fifth embodiment shown in FIG. 15. A configuration of a shift register circuit and a configuration of a liquid crystal display device when a plurality of unit shift register circuits 122e are used are similar to those of the fifth embodiment. A clock signal CKA is the same as the clock signal CKA of the fifth embodiment. In addition, a clock signal CKB is the same as the clock signal CKB of the fifth embodiment.

As shown in FIG. 25, in addition to the pull-down circuit of the fifth embodiment, a CLR signal (a predetermined clear signal) is added to the unit shift register circuit 122e of the sixth embodiment, and a T7 and a T8 whose gates receive input of the CLR signal are respectively connected to the node VC and the node OUT. Here, the T7 has a drain connected to the node VC and a source connected to the node OUT.

In addition, the T8 has a drain connected to the node OUT and a source connected to a VSS power source. According to this configuration, the node VC and the output terminal OUT (GL) can be pulled down by setting CLR signal=H. This CLR signal is a signal input from outside of the unit shift register circuit 122e.

When a shift register circuit is configured using a plurality of unit shift register circuits 122e of the sixth embodiment, all stages of the shift register circuit can be initialized at once. By performing clearing in the first scanning period, for example, an unexpected operation and output are suppressed in an operable state from the initialized state. In addition, by performing clearing in the last scanning period, the circuit is initialized and each of nodes is discharged. Thus, degradation of TFTs caused by remaining charge during stoppage of operation can be prevented.

Seventh Embodiment

Figure 26:
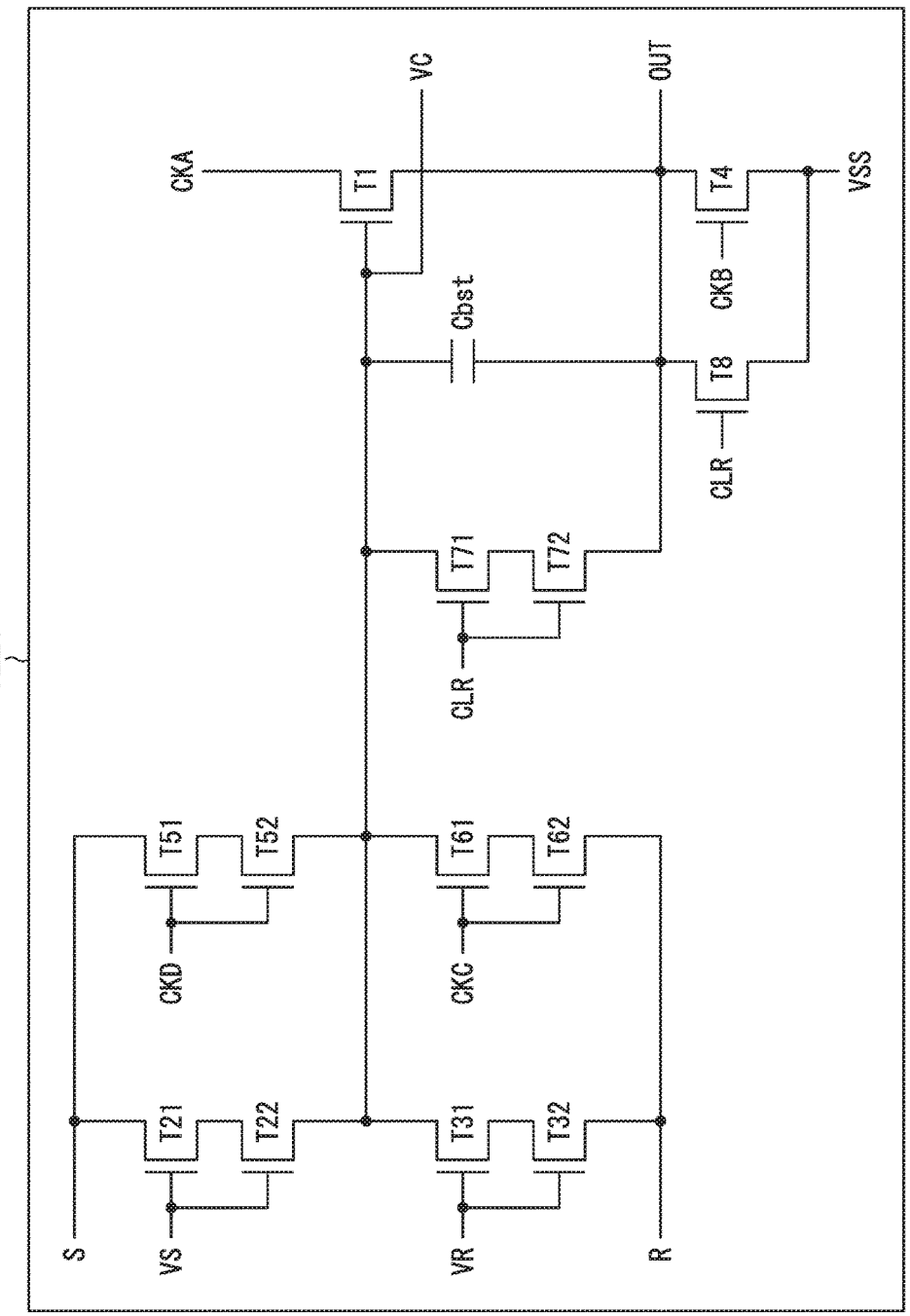
FIG. 26 is a block diagram showing a configuration example of a unit shift register circuit 122f (a seventh embodiment) according to the present invention.

Next, a seventh embodiment of the present invention will be described with reference to FIG. 26. As shown in FIG. 26, a unit shift register circuit 122f of the seventh embodiment has different configurations of T2, T3, T5, T6 and T7 from those of the unit shift register circuit 122f of the sixth embodiment shown in FIG. 25. A configuration of a shift register circuit and a configuration of a liquid crystal display device when a plurality of unit shift register circuits 122f are used are similar to those of the fifth embodiment.

The unit shift register circuit 122f of the seventh embodiment has a characteristic of a dual configuration composed of a plurality of transistors in which the T2, T3, T5, T6 and T7 according to the sixth embodiment are in cascode connection. In other words, in the unit shift register circuit 122f of the seventh embodiment, the T2 is constituted by a plurality of transistors T21 and T22 that are in cascode connection, i.e., in this case, the gates thereof are connected to each other and a drain of one transistor is connected to a source of the other transistor. A signal VS is input to the gates of the T21 and the T22, a signal S is input to the drain of the T21, and the source of the T22 is connected to the node VC. In addition, the T3 is constituted by a plurality of transistors T31 and T32 that are in cascode connection, i.e., in this case, the gates thereof are connected to each other and a drain of one transistor is connected to a source of the other transistor. A signal VR is input to the gates of the T31 and the T32, a signal R is input to the drain of the T32, and the source of the T31 is connected to the node VC. Furthermore, the T5 is constituted by a plurality of transistors T51 and T52 that are in cascode connection, i.e., in this case, the gates thereof are connected to each other and a drain of one transistor is connected to a source of the other transistor. A clock signal CKD is input to the gates of the T51 and the T52, a signal S is input to the drain of the T51, and the source of the T52 is connected to the node VC. In addition, the T6 is constituted by a plurality of transistors T61 and T62 that are in cascode connection, i.e., in this case, the gates thereof are connected to each other and a drain of one transistor is connected to a source of the other transistor. A clock signal CKC is input to the gates of the T61 and the T62, a signal R is input to the drain of the T62, and the source of the T61 is connected to the node VC. Furthermore, the T7 is constituted by a plurality of transistors T71 and T72 that are in cascode connection, i.e., in this case, the gates thereof are connected to each other and a drain of one transistor is connected to a source of the other transistor. The T71 and the T72 whose gates receive input of a CLR signal are respectively connected to the node VC and a node OUT. Here, the drain of the T71 is connected to the node VC, and the source of the T72 is connected to the node OUT.

With the dual TFTs (the T2, T3, T5, T6 and T7), a potential difference (a voltage between a drain and a source) occurring between VDSs of TFTs can be reduced to about a half when the node VC is boosted by a bootstrap at the time of an operation, and thus voltage withstanding can improve. While a driving force decreases due to the dual configuration, boosted gate voltages are input to the TFTs in a set operation and a reset operation in the present embodiment.

Thus, a sufficient driving force can be obtained, and an impact from sizes of the TFTs is eliminated.

Eighth Embodiment

Figure 27:
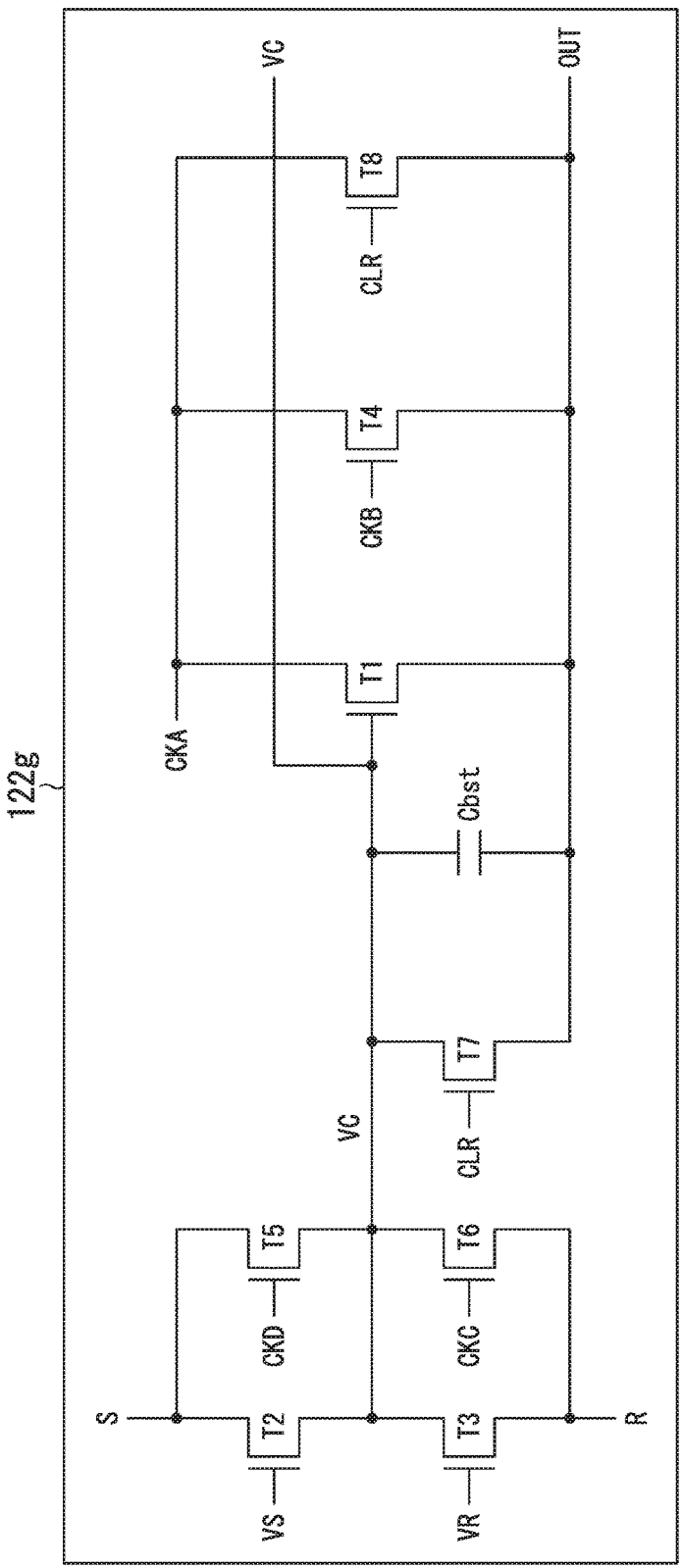
FIG. 27 is a block diagram showing a configuration example of a unit shift register circuit 122g (an eighth embodiment) according to the present invention.
Figure 28:
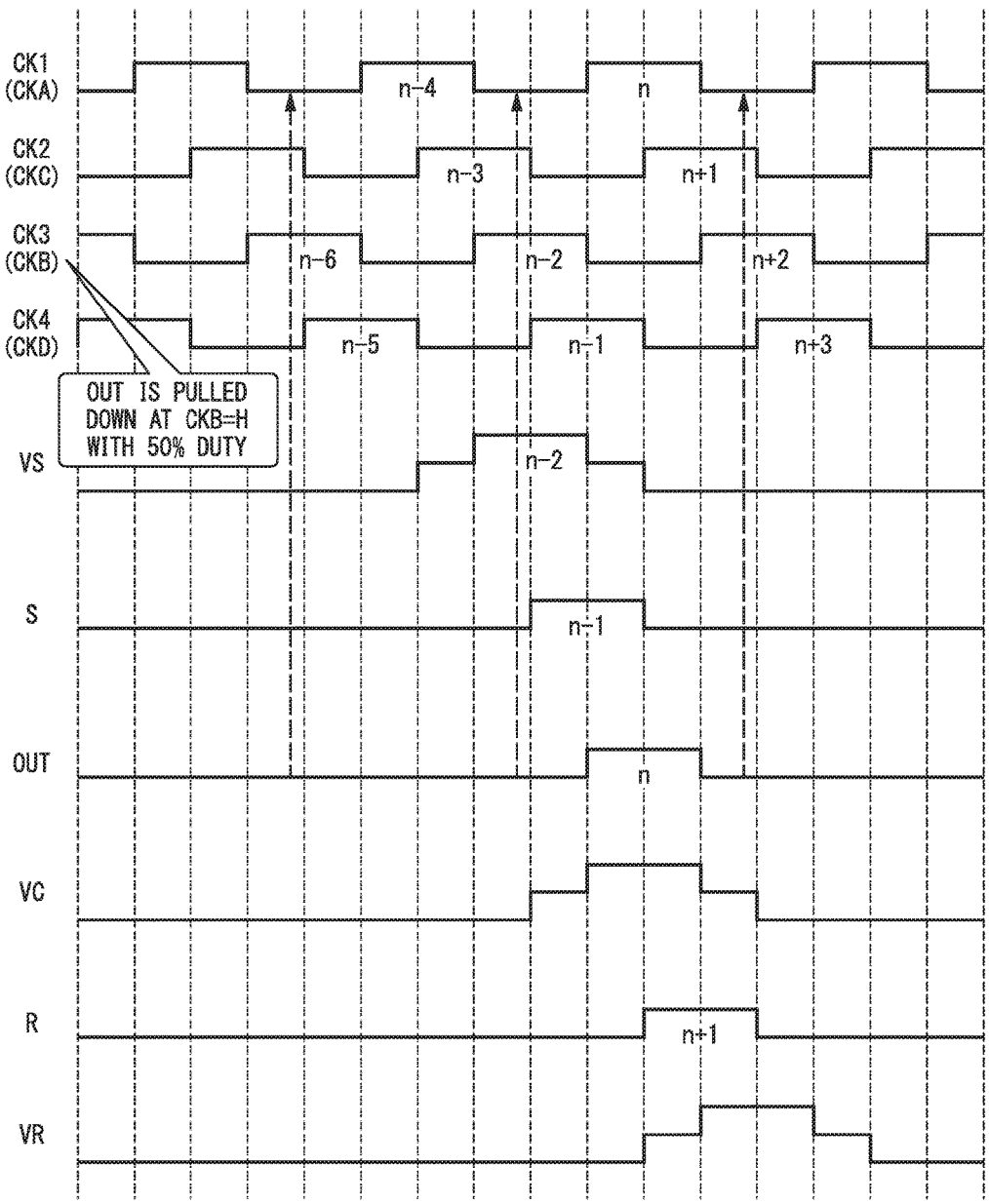
FIG. 28 is a timing chart of an operation of the unit shift register circuit 122g shown in FIG. 27 (the eighth embodiment).

Next, an eighth embodiment of the present invention will be described with reference to FIGS. 27 and 28. FIG. 27 is a block diagram showing a configuration example of a unit shift register circuit 122g (an eighth embodiment) according to the present invention. In addition, FIG. 28 is a timing chart of an operation of the unit shift register circuit 122g shown in FIG. 27 (the eighth embodiment). As shown in FIG. 27, the unit shift register circuit 122g of the eighth embodiment has a different configuration for a circuit for pulling down an output terminal OUT (a pull-down circuit) from that of the unit shift register circuit 122e of the sixth embodiment shown in FIG. 25. A configuration of a shift register circuit and a configuration of a liquid crystal display device when a plurality of unit shift register circuits 122g are used are similar to those of the fifth embodiment. A clock signal CKA is the same as the clock signal CKA of the fifth embodiment. In addition, a clock signal CKB is the same as a clock signal CKB of the fifth embodiment.

As shown in FIG. 27, the unit shift register circuit 122g of the eighth embodiment has a pull-down circuit configured by a T4 and a T8. The T4 has a gate connected to the CKB, a source connected to the CKA, and a drain connected to the node OUT. The T8 has a gate connected to CLR, a source connected to the CKA, and a drain connected to the node OUT. The unit shift register circuit 122g of the eighth embodiment performs pull-down of the GL on the CKA with the CKB having a phase different by 180 degrees, rather than VSS (constant voltage source). Accordingly, the T4 can perform a similar operation to that of the T4 of the first to seventh embodiments.

When connection is made such that CKA=CK1 and CKB=CK3, the OUT is connected to CKA via the T4 in a period of CKB=H at the timings indicated by the dotted arrow in FIG. 28. Although FIG. 28 shows a case in which the duty in H periods of the clock is 50%, if the CKA and the CKB are set to be signals having phases deviating from each other by 180 degrees and have no overlaps (duties in H periods of the clocks are 50% or lower), pull-down is possible without the VSS.

In the eighth embodiment, since a size of a wiring area, the number of terminals of a panel, and a size of a terminal area can be reduced, a frame size around the terminals, and a frame size of a periphery in which a gate driver of the panel is placed can be reduced.

Ninth Embodiment

Figure 29:
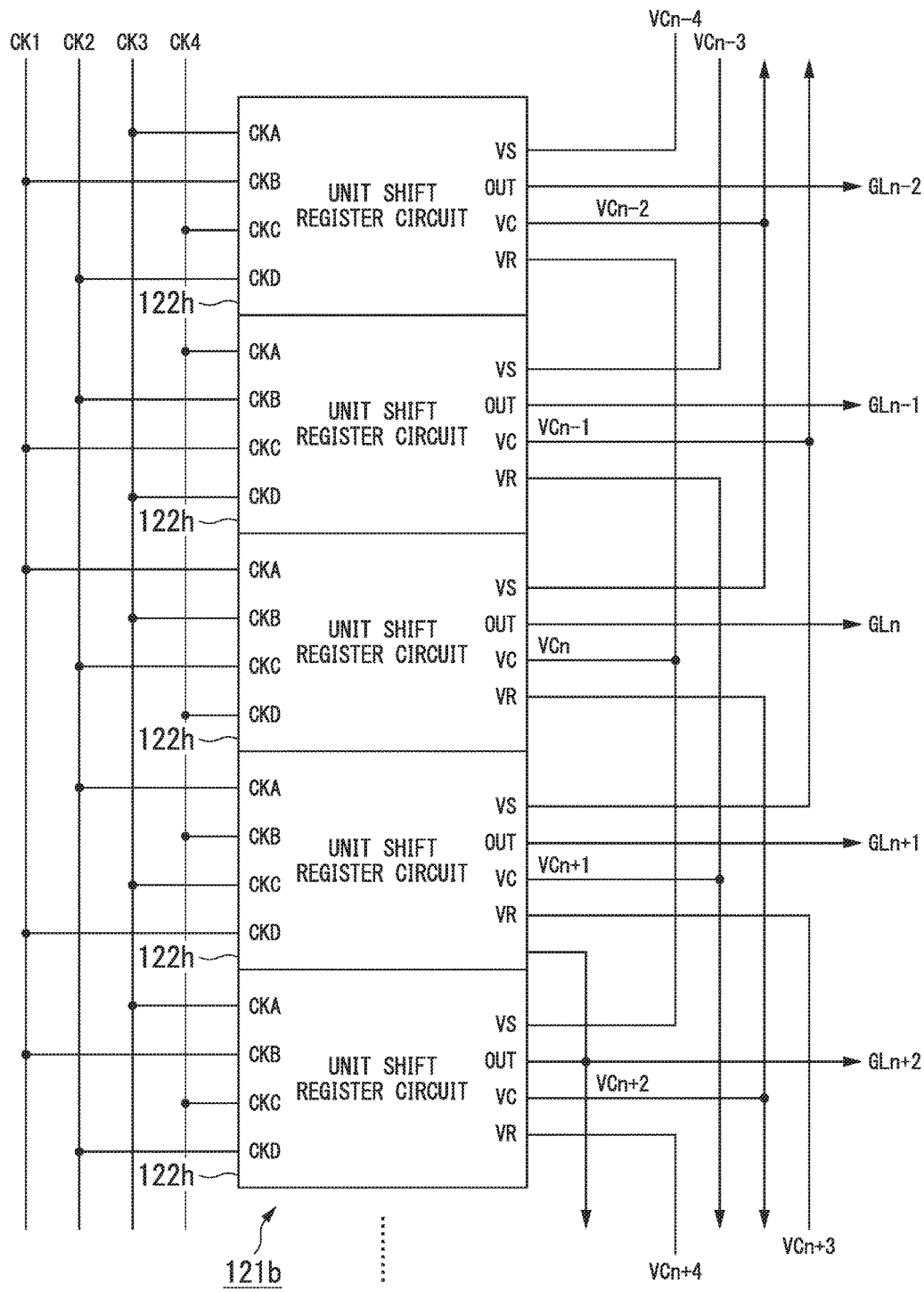
FIG. 29 is a block diagram showing a configuration example of a shift register circuit (a ninth embodiment) according to the present invention.

Next, a ninth embodiment of the present invention will be described with reference to FIGS. 29 and 30. FIG. 29 is a block diagram showing a configuration example of a shift register circuit (a ninth embodiment) according to the present invention. FIG. 29 shows 5 unit shift register circuits 122h and their input and output signal lines.

In the configuration example shown in FIG. 29, the shift register circuit 121b is constituted by a plurality of stages (steps) in cascade connection. Each unit shift register circuit 122h constituting a stage has a clock terminal CKA, a clock terminal CKC, a clock terminal CKD, a terminal VS connected to a gate terminal of a transistor T2, an output terminal OUT, a terminal VC connected to a node VC, and a terminal VR connected to a gate terminal of a transistor T3.

In the unit shift register circuit 122h of the N-th stage, an output VCn−2 of the stage before the preceding stage is input as a signal VS that is an input signal of the terminal VS of the N-th stage, and an output VCn+2 of the stage after the subsequent stage is input as a signal VR that is an input signal of the terminal VR of the N-th stage.

A clock signal CKA input to the clock terminal CKA, a clock signal CKB input to the clock terminal CKB, a clock signal CKC input to the clock terminal CKC, and a clock signal CKD input to the clock terminal CKD are 4-phase clock signals, and are connected to the unit shift register circuits 122h as follows. In other words, the signals are connected in each of the 4 stages of the unit shift register circuits 122h in order like this: CKA=CK1, CKB=CK3, CKC=CK2 and CKD=CK4; CKA=CK2, CKB=CK4, CKC=CK3 and CKD=CK1; CKA=CK3, CKB=CK1, CKC=CK4 and CKD=CK2; CKA=CK4, CKB=CK2, CKC=CK1 and CKD=CK3; CKA=CK1, CKB=CK3, CKC=CK2 and CKD=CK4; CKA=CK2, CKB=CK4, CKC=CK3 and CKD=CK1; and so on. Here, the clock signal CKA and the clock signal CKB are opposite phased clock signals to each other. In addition, in a FWD operation, the operation progresses in order of a clock signal CKA, a clock signal CKD, a clock signal CKB, and a clock signal CKC with their cycles deviating backward by ¼ of a cycle from each other, and in a BWD operation, the operation progresses in order of a clock signal CKA, a clock signal CKD, a clock signal CKB, and a clock signal CKC with their cycles deviating forward by ¼ of a cycle from each other.

Figure 30:
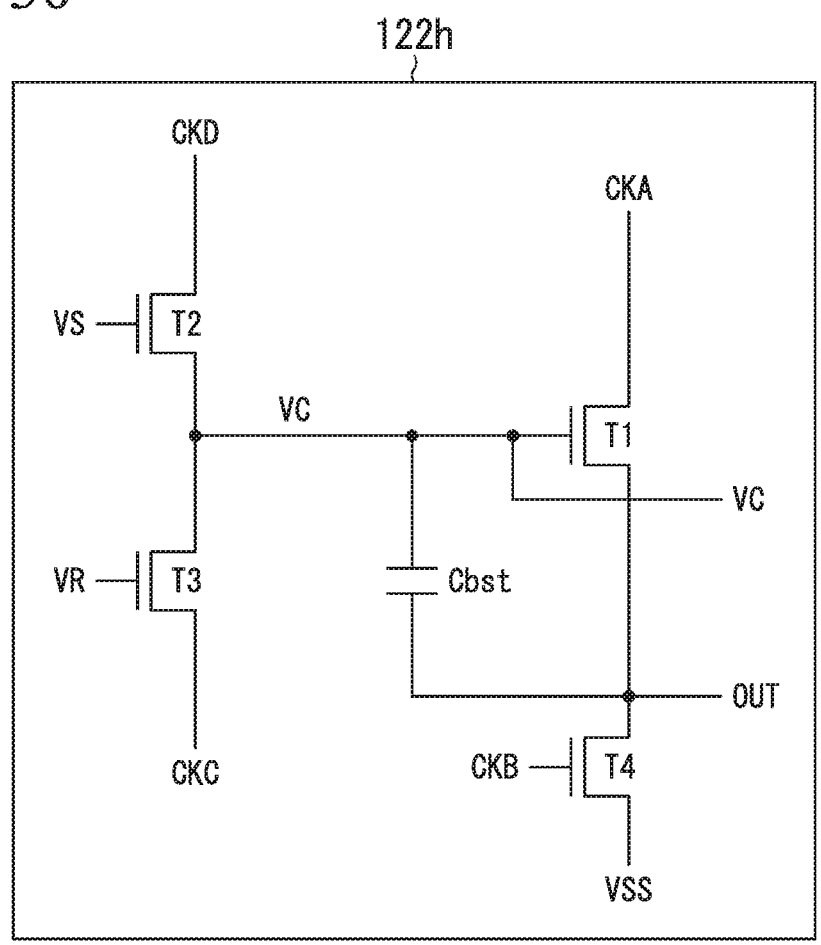
FIG. 30 is a block diagram showing a configuration example of a unit shift register circuit 122h shown in FIG. 29 (the ninth embodiment).

FIG. 30 is a block diagram showing a configuration example of a unit shift register circuit 122h shown in FIG. 29 (the ninth embodiment).

As shown in FIG. 30, the unit shift register circuit 122h is constituted by a T1 and a T4 connected to the GL (OUT) for driving each scanning line and transistors T2 and T3 that are connected to a node VC that is a gate terminal of the T1. A gate terminal of the T2 is connected to a signal VS and a drain terminal thereof is connected to the clock signal CKD. In addition, a gate terminal of the T3 is connected to a signal VR and a drain terminal thereof is connected to the clock signal CKC.

The T1 is an output transistor for outputting pulse signals to the output terminal OUT. The T1 has a drain connected to the clock terminal CKA, the gate connected to the node VC, and a source connected to the output terminal OUT.

The T2 has the gate connected to the terminal VS, the drain connected to the clock terminal CKD, and a source connected to the node VC.

The T3 has the gate connected to the terminal VR, the drain connected to the clock signal CKC, and a source connected to the node VC.

The T4 has a gate connected to the clock terminal CKB, a drain connected to the output terminal OUT, and a source connected to a terminal VSS. The power source voltage VSS is a reference voltage for operations of the unit shift register circuit 122.

Figure 31:
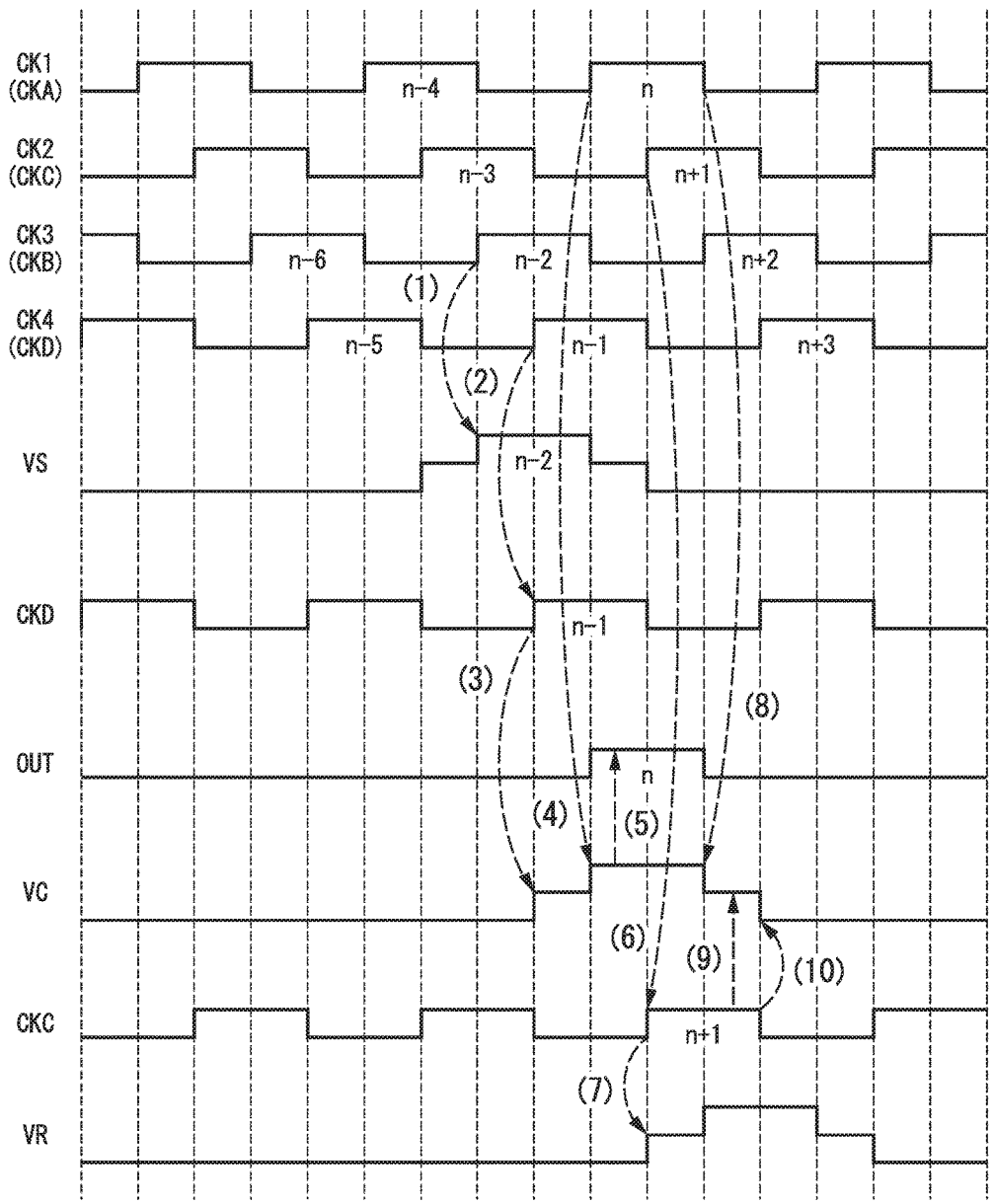
FIG. 31 is a timing chart of a FWD direction operation of the unit shift register circuit 122h shown in FIG. 30 (the ninth embodiment).

Next, an operation example of the unit shift register circuit 122h shown in FIG. 30 will be described with reference to FIGS. 31 and 32. FIG. 31 is a timing chart of a FWD direction operation of the unit shift register circuit 122h shown in FIG. 30 (the ninth embodiment). Driving of the unit shift register circuit 122h of the N (=n)-th stage is performed as follows.

The unit shift register circuit 122h of the stage before the preceding stage operates and a boosted (voltage of) node VCn−2 is input to the terminal VS at the timing indicated by (1) and its relevant dotted arrow in FIG. 31.

Next, CK4 is input to CKD at the timing indicated by (2) in FIG. 31.

Here, VS is a boosted voltage, and the node VC is charged with an input signal from a CKD as it is at the timing indicated by (3) in FIG. 31.

Next, when a pulse of CK1 is given in a state in which the gate terminal of the T1 is charged, the node VC is boosted in a bootstrap operation and has a high potential at the timing indicated by (4) in FIG. 31.

Here, since the node VC is boosted to a sufficiently high voltage at the timing indicated by (5) in FIG. 31, the pulse of the CK is output to the output terminal OUT, i.e., GLn.

At the same time, CK2 is input to a CKC at the timing indicated by (6) in FIG. 17, and an output of the preceding stage is output to GLn+1 due to a rise of CK2.

The node VC of the stage after the subsequent stage is precharged due to a rise of the CKC at the timing indicated by (7) in FIG. 31.

The output OUT is pulled down due to a fall in the pulse of CK1 and the voltage of the node VC decreases to the value before the boosting at the timing indicated by (8) in FIG. 31.

When the VR is boosted at the timing indicated by (9) in FIG. 31, the node VC is fixed to the CKC.

When the node CKC is pulled down at the timing indicated by (10) in FIG. 31, the node VC is also pulled down.

Figure 32:
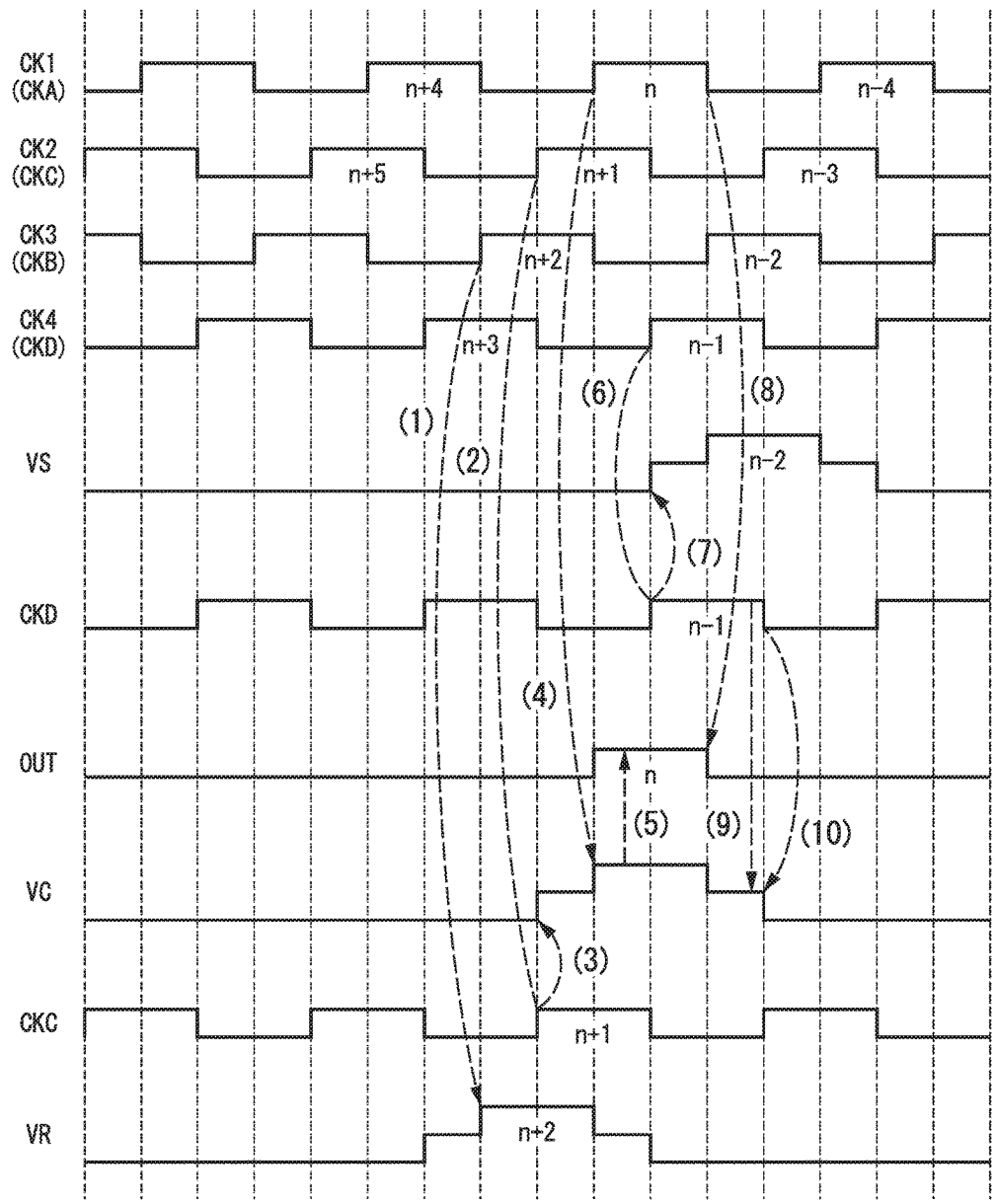
FIG. 32 is a timing chart of a BWD direction operation of the unit shift register circuit 122h shown in FIG. 30 (the ninth embodiment).

FIG. 32 is a timing chart of a BWD direction operation of the unit shift register circuit 122h shown in FIG. 30 (the ninth embodiment). Driving of the unit shift register circuit 122h in the N (=n)-th stage is performed as follows.

The unit shift register circuit 122h of the stage after the subsequent stage operates and a boosted (voltage of) node VCn+2 is input to the terminal VR at the timing indicated by (1) and its relevant dotted arrow in FIG. 32.

Next, CK2 is input to the CKC at the timing indicated by (2) in FIG. 32.

Here, the VR is a boosted voltage and the node VC is charged by an input signal from the CKC as it is at the timing indicated by (3) in FIG. 32.

Next, when a pulse of CK1 is given in a state in which the gate terminal of the T1 is charged, the node VC is boosted in a bootstrap operation and has a high potential at the timing indicated by (4) in FIG. 32.

Here, since the node VC is boosted to a sufficiently high voltage at the timing indicated by (5) in FIG. 32, the pulse of the CK is output to the output terminal OUT, i.e., GLn.

At the same time, CK4 is input to the CKD at the timing indicated by (6) in FIG. 32, and an output of the preceding stage is output to GLn−1 due to a rise of CK4.

Further, the node VC of the stage before the preceding stage is precharged with GLn−1 at the timing indicated by (7) in FIG. 32.

The output OUT is pulled down due to a fall of the pulse of CK1 and the voltage of the node VC decreases to the value before the boosting at the timing indicated by (8) in FIG. 32.

When VS is boosted at the timing indicated by (9) in FIG. 32, the node VC is fixed to the output from the CKD.

When the node CKD is pulled down at the timing indicated by (10) in FIG. 32, the node VC is also pulled down.

In comparison to the unit shift register circuit 122 (the first embodiment shown in FIG. 3), the unit shift register circuit 122h (the ninth embodiment shown in FIG. 30) has a changed connection method for an input S to the CKD and an input R to the CKC in the T2 and the T3. When the CKD and the CKC are input, while voltage stress of the TFTs (T2 and T3) increases, a set voltage and a reset voltage become clock signals, rather than GL potentials, and there is an effect that there is no influence of bluntness of the GL waveforms caused by degradation by stress. Note that the connection method of an input S to the CKD and an input R to the CKC in the T2 and the T3 may also be changed for the unit shift register circuit 122a (the second embodiment shown in FIG. 8), the unit shift register circuit 122b (the third embodiment shown in FIG. 10), the unit shift register circuit 122c (the fourth embodiment shown in FIG. 12), the unit shift register circuit 122d (the fifth embodiment shown in FIG. 15), the unit shift register circuit 122e (the sixth embodiment shown in FIG. 25), the unit shift register circuit 122f (the seventh embodiment shown in FIG. 26), and the unit shift register circuit 122g (the eighth embodiment shown in FIG. 27) similarly to the unit shift register circuit 122h. In all cases, a basic operation and effects do not change.

Tenth Embodiment

Figure 33:
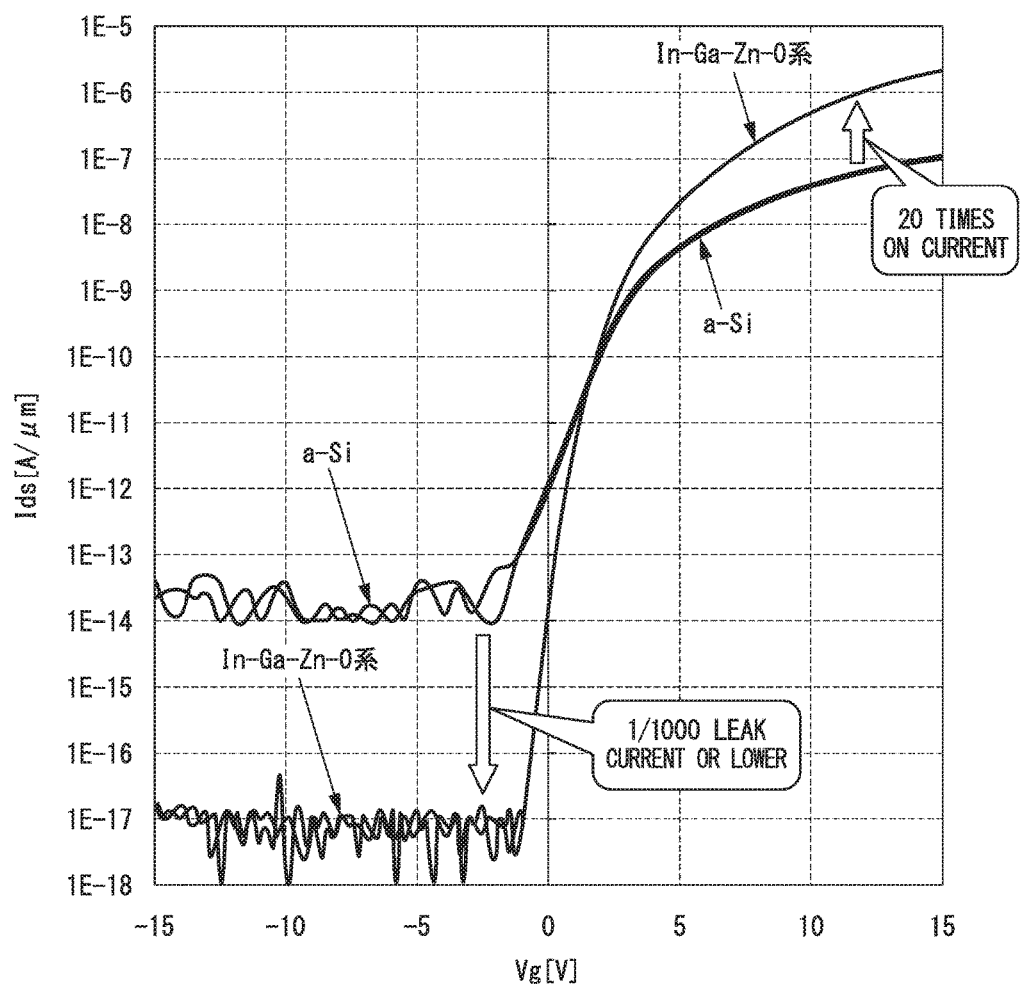
FIG. 33 is a characteristics diagram showing an example of characteristics of a TFT that contains an oxide semiconductor in a semiconductor layer (an illustrative diagram of a tenth embodiment).

Next, a tenth embodiment of the present invention will be described with reference to FIG. 33. FIG. 33 is a characteristics diagram showing an example of characteristics of a TFT that contains an oxide semiconductor in a semiconductor layer (an illustrative diagram of the tenth embodiment). The tenth embodiment has characteristics of materials of semiconductor layers of the TFTs included in the above-described unit shift register circuits 122, 122a, 122b, 122c, 122d, 122e, 122f, 122g, and 122h. In other words, the TFTs used in each of the embodiments are configured using oxide semiconductors such as indium gallium zinc oxide (In—Ga—Zn—O-based semiconductors; which are oxide semiconductors containing indium (In), gallium (Ga), zinc (Zn), and oxygen (O)) in semiconductor layers.

In this case, an oxide semiconductor layer is, for example, an In—Ga—Zn—O-based semiconductor layer. The oxide semiconductor layer includes, for example, an In—Ga—Zn—O-based semiconductor. Here, the In—Ga—Zn—O-based semiconductor is a ternary oxide of indium (In), gallium (Ga), and zinc (Zn), and a ratio (composition ratio) between In, Ga, and Zn is not particularly limited, and includes, for example, In:Ga:Zn=2:2:1, In:Ga:Zn=1:1:1, In:Ga:Zn=1:1:2, and the like. In the present embodiment, for example, an In—Ga—Zn—O-based semiconductor film containing In, Ga, and Zn at a ratio of 1:1:1 is used for semiconductor layers of TFTs.

Since a TFT with an In—Ga—Zn—O-based semiconductor layer has high mobility (which exceeds 20 times that of an a-Si TFT) and a small current leakage (which is equal to or less than 1/1000 in comparison to an a-Si TFT), such TFTs are preferably used as driving TFTs and pixel TFTs. If a TFT in which an In—Ga—Zn—O-based semiconductor layer is used, power consumption of a display device can be dramatically reduced. FIG. 33 is a characteristics diagram showing a correspondence between a gate voltage and a drain-source current. In FIG. 33, the horizontal axis represents gate voltage Vg and the vertical axis represents drain-source current Ids. FIG. 33 also shows comparison of characteristics correspondences between gate voltages and drain-source currents of the TFT using an In—Ga—Zn—O-based semiconductor layer as a semiconductor layer and a TFT using amorphous silicon a-Si.

The In—Ga—Zn—O-based semiconductor may be amorphous, or may have crystallinity and contain a crystalline substance. As a crystalline In—Ga—Zn—O-based semiconductor, a crystalline In—Ga—Zn—O-based semiconductor whose c axis is oriented substantially perpendicular to a layer plane is preferable. A crystalline structure of such an In—Ga—Zn—O-based semiconductor is disclosed in, for example, Japanese Unexamined Patent Application, First Publication No. 2012-134475. The entire content of the disclosure of Japanese Unexamined Patent Application, First Publication No. 2012-134475 is incorporated in the present specification by reference.

The above-described oxide semiconductor layer may contain another oxide semiconductor, instead of an In—Ga—Zn—O-based semiconductor. For example, a Zn—O-based semiconductor (ZnO), an In—Zn—O-based semiconductor (IZO (a registered trademark)), a Zn—Ti—O-based semiconductor (ZTO), a Cd—Ge—O-based semiconductor, a Cd—Pb—O-based semiconductor, cadmium oxide (CdO), an Mg—Zn—O-based semiconductor, an In—Sn—Zn—O-based semiconductor (e.g., $In_2O_3$—$SnO_2$—ZnO), an In—Ga—Sn—O-based semiconductor, or the like may be contained.

As described above, according to each embodiment of the present invention, when a unit shift register circuit is caused to perform a forward shift operation, it is possible to set a second transistor as a set transistor and a third transistor as a reset transistor, and when the circuit is caused to perform a backward shift operation, it is possible to set the third transistor as a set transistor and the second transistor as a reset transistor. In addition, when it is caused to perform the forward shift operation, a first input signal and a second input signal which are different from each other (however, a voltage of the first input signal<a voltage of the second input signal) are input to a second source terminal and a second gate terminal of the second transistor serving as a set transistor, and thus a first gate terminal of a first transistor that is an output transistor can be charged (i.e., precharged). In addition, when it is caused to perform the backward shift operation, a third input signal and a fourth input signal which are different from each other (however, a voltage of the third input signal<a voltage of the fourth input signal) are input to a third source terminal and a third gate terminal of the third transistor serving as a set transistor, and thus the first gate terminal of the first transistor that is an output transistor can be charged. In this case, for a second input signal or a fourth input signal, for example, a signal of a first gate terminal of an output transistor of another unit shift register circuit can be used, and thus a precharge voltage of the output transistor does not decrease by a threshold voltage of the set transistor. Thus, an influence of characteristics degradation can be reduced.

In addition, since a switching operation is possible in a bi-directional shift operation, two pairs of set TFTs and reset TFTs are not necessary, and thus the number of circuit elements can be reduced. Therefore, according to the unit shift register circuit of one aspect of the present invention, it is possible to provide a unit shift register circuit which can easily reduce the influence of characteristics degradation and perform bi-directional shift operations with a fewer number of circuit elements.

Note that an embodiment of the present invention is not limited to the above. For example, a modification of combining configurations of the above-described embodiments or omitting a part of a configuration included in each embodiment can be appropriately made.

DESCRIPTION OF THE REFERENCE SYMBOLS

100 liquid crystal display device
110 display region
120 scanning line driving circuit
121, 121a, 121b shift register circuit
130 signal line driving circuit
PIX pixel
GL1 to GLn scanning line
122, 122a to 122h unit shift register circuit
T1 to T10 TFT
Cbst, Cb capacitive element

The invention claimed is:

1. A unit shift register circuit constituting each stage of a shift register circuit, the unit shift register circuit comprising:
   a first transistor that includes a first gate terminal, a first source terminal, and a first drain terminal, receives a first clock signal to the first drain terminal, and outputs an output signal from the first source terminal; a second transistor that includes a second gate terminal, a second source terminal, and a second drain terminal, the second source terminal being connected to the first gate terminal of the first transistor, receives a first input signal to the second drain terminal, and inputs a second input signal to the second gate terminal; and
   a third transistor that includes a third gate terminal, a third source terminal, and a third drain terminal, the third source terminal being connected to the first gate terminal of the first transistor, receives a third input signal to the third drain terminal, and inputs a fourth input signal to the third gate terminal,
   wherein, in a forward shift operation, the second input signal having a higher voltage than a voltage of the first input signal is input to the second gate terminal in a case that the first gate terminal of the first transistor is charged, and the fourth input signal having a higher voltage than a voltage of the third input signal is input to the third gate terminal in a case that the first gate terminal of the first transistor is discharged, and
   wherein, in a backward shift operation, the fourth input signal having a higher voltage than a voltage of the third input signal is input to the third gate terminal in a case that the first gate terminal of the first transistor is charged, and the second input signal having a higher voltage than a voltage of the first input signal is input to the second gate terminal in a case that the first gate terminal of the first transistor is discharged.

2. The unit shift register circuit according to claim 1,
   wherein the first input signal is an output signal of the unit shift register circuit at a preceding stage of the unit shift register circuit,
   wherein the second input signal is a signal of the first gate terminal of the first transistor of the unit shift register circuit of the stage before the preceding stage of the unit shift register circuit,
   wherein the third input signal is an output signal of the unit shift register circuit at a subsequent stage of the unit shift register circuit, and
   wherein the fourth input signal is a signal of the first gate terminal of the first transistor of the unit shift register circuit of the stage after the subsequent stage of the unit shift register circuit.

3. The unit shift register circuit according to claim 1,
   wherein the first input signal is a clock signal whose cycle deviates backward from the first clock signal by ¼ of a cycle in a forward shift operation and whose cycle deviates forward from the first clock signal by ¼ of a cycle in a backward shift operation, wherein the second input signal is a signal of the first gate terminal of the first transistor of the unit shift register circuit of the stage before the preceding stage of the unit shift register circuit, wherein the third input signal is a clock signal whose cycle deviates forward from the first clock signal by ¼ of a cycle in a forward shift operation and whose cycle deviates backward from the first clock signal by ¼ of a cycle in a backward shift operation, and wherein the fourth input signal is a signal of the first gate terminal of the first transistor of the unit shift register circuit of the stage after the subsequent stage of the unit shift register circuit.

4. The unit shift register circuit according to claim 1, wherein, in the forward shift operation, in a case that the second transistor charges the first gate terminal of the first transistor, the first input signal and the second input signal rise, and after the first gate terminal is charged, a voltage of the second input signal falls earlier than a fall of a voltage of the first input signal, and wherein, in the backward shift operation, in a case that the third transistor charges the first gate terminal of the first transistor, the third input signal and the fourth input signal rise, and after the first gate terminal is charged, a voltage of the fourth input signal falls earlier than a fall of a voltage of the third input signal.

5. The unit shift register circuit according to claim 1, wherein the first transistor boosts the output signal through a bootstrap operation of boosting a voltage of the first gate terminal using a voltage charged in a parasitic capacitance between the first source terminal and the first gate terminal.

6. The unit shift register circuit according to claim 1, wherein, in the forward shift operation, in a case that the third transistor discharges the first gate terminal of the first transistor, the third input signal and the fourth input signal rise, and after the first gate terminal is discharged, a voltage of the third input signal falls earlier than a fall of a voltage of the fourth input signal, and wherein, in the backward shift operation, in a case that the second transistor discharges the first gate terminal of the first transistor, the first input signal and the second input signal rise, and after the first gate terminal is discharged, a voltage of the first input signal falls earlier than a fall of a voltage of the second input signal.

7. The unit shift register circuit according to claim 1, further comprising:
a capacitive element connected between the first gate terminal and the first source terminal of the first transistor.

8. The unit shift register circuit according to claim 1, further comprising:
a pull-down circuit that pulls down the output signal of the first source terminal in accordance with a second clock signal having an opposite phase to the first clock signal.

9. The unit shift register circuit according to claim 1, further comprising: a fifth transistor that connects the first gate terminal and the first source terminal of the first transistor in accordance with the first clock signal.

10. The unit shift register circuit according to claim 1, further comprising:
a pull-down circuit that pulls down the first gate terminal of the first transistor in accordance with a voltage of the first gate terminal.

11. The unit shift register circuit according to claim 10, wherein the pull-down circuit includes an inverter circuit that includes the first gate terminal as an input and a fifth transistor of which a gate receives input of the output of the inverter circuit and a drain terminal is connected to the first gate terminal, and pulls down the first gate terminal in accordance with a voltage of the first gate terminal.

12. The unit shift register circuit according to claim 1, further comprising:
a pull-down circuit that pulls down the first gate terminal of the first transistor in accordance with a second clock signal having an opposite phase to the first clock signal and a voltage of the first gate terminal.

13. The unit shift register circuit according to claim 12, wherein the pull-down circuit includes a push-pull circuit for the first clock signal and the second clock signal having an opposite phase, a seventh transistor of which a gate terminal receives input of the first gate terminal that pulls down an output node of the push-pull circuit, and a fifth transistor of which a gate receives input of the output node of the push-pull circuit and a drain terminal is connected to the first gate terminal, and the first gate terminal is pulled down in accordance with a voltage of the first gate terminal.

14. The unit shift register circuit according to claim 1, further comprising:
a fifth transistor that is connected to the second transistor in parallel, of which a gate receives input of a clock signal of which a cycle deviates backward from the first clock signal by ¼ of a cycle in the forward shift operation and a cycle deviates forward from the first clock signal by ¼ of a cycle in the backward shift operation; and a sixth transistor that is connected to the third transistor in parallel, of which a gate receives input of a clock signal of which a cycle deviates forward from the first clock signal by ¼ of a cycle in the forward shift operation and a cycle deviates backward from the first clock signal by ¼ of a cycle in the backward shift operation.

15. The unit shift register circuit according to claim 1, further comprising:
a pull-down circuit that pulls down the output signal of the first source terminal and the first gate terminal of the first transistor in accordance with a predetermined clear signal.

16. The unit shift register circuit according to claim 1, wherein the second transistor and the third transistor connected to the first gate terminal of the first transistor are constituted by a plurality of transistors in cascade connection.

17. The unit shift register circuit according to claim 16, further comprising:
a pull-down circuit that pulls down the output signal of the first source terminal in accordance with a second clock signal having an opposite phase to the first clock signal.

18. The unit shift register circuit according to claim 1, wherein at least the first transistor, the second transistor, and the third transistor include an oxide semiconductor in a semiconductor layer.

19. A control method for a unit shift register circuit that constitutes each stage of a shift register circuit,
wherein the unit shift register circuit includes:
a first transistor that includes a first gate terminal, a first source terminal, and a first drain terminal, receives a clock signal to the first drain terminal, and outputs an output signal from the first source terminal; a second transistor that includes a second gate terminal, a second source terminal, and a second drain terminal, the second source terminal being connected to the first gate terminal of the first transistor, receives a first input signal to the second drain terminal, and inputs a second input signal to the second gate terminal; and a third transistor that includes a third gate terminal, a third source terminal, and a third drain terminal, the third source terminal being connected to the first gate terminal of the first transistor, receives a third input signal to the third drain terminal, and inputs a fourth input signal to the third gate terminal, wherein, in a forward shift operation, the second input signal having a higher voltage than a voltage of the first input signal is input to the second gate terminal in a case that the first gate terminal of the first transistor is charged, and the fourth input signal having a higher voltage than a voltage of the third input signal is input to the third gate terminal in a case that the first gate terminal of the first transistor is discharged, and wherein, in a backward shift operation, the fourth input signal having a higher voltage than a voltage of the third input signal is input to the third gate terminal in a case that the first gate terminal of the first transistor is charged, and the second input signal having a higher voltage than a voltage of the first input signal is input to the second gate terminal in a case that the first gate terminal of the first transistor is discharged.

20. A display device comprising:

a plurality of pixels;

a plurality of scanning lines to which the plurality of pixels are connected; and a plurality of unit shift register circuits respectively constituting stages of a shift register circuit, wherein each of the plurality of unit shift register circuits includes:

a first transistor that includes a first gate terminal, a first source terminal, and a first drain terminal, receives a clock signal to the first drain terminal, and outputs an output signal from the first source terminal; a second transistor that includes a second gate terminal, a second source terminal, and a second drain terminal, the second source terminal being connected to the first gate terminal of the first transistor, receives a first input signal to the second drain terminal, and inputs a second input signal to the second gate terminal; and a third transistor that includes a third gate terminal, a third source terminal, and a third drain terminal, the third source terminal being connected to the first gate terminal of the first transistor, receives a third input signal to the third drain terminal, and inputs a fourth input signal to the third gate terminal, wherein, in a forward shift operation, the second input signal having a higher voltage than a voltage of the first input signal is input to the second gate terminal in a case that the first gate terminal of the first transistor is charged, and the fourth input signal having a higher voltage than a voltage of the third input signal is input to the third gate terminal in a case that the first gate terminal of the first transistor is discharged, and wherein, in a backward shift operation, the fourth input signal having a higher voltage than a voltage of the third input signal is input to the third gate terminal in a case that the first gate terminal of the first transistor is charged, and the second input signal having a higher voltage than a voltage of the first input signal is input to the second gate terminal in a case that the first gate terminal of the first transistor is discharged.

* * * * *